United States Patent
Fujii et al.

(10) Patent No.: US 12,237,640 B2
(45) Date of Patent: Feb. 25, 2025

(54) LINE NARROWING DEVICE AND ELECTRONIC DEVICE MANUFACTURING METHOD

(71) Applicant: Gigaphoton Inc., Tochigi (JP)

(72) Inventors: Koichi Fujii, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 198 days.

(21) Appl. No.: 17/819,013

(22) Filed: Aug. 11, 2022

(65) Prior Publication Data

US 2022/0385028 A1  Dec. 1, 2022

Related U.S. Application Data

(63) Continuation of application No. PCT/JP2020/012542, filed on Mar. 19, 2020.

(51) Int. Cl.
| | |
|---|---|
| *G03F 7/20* | (2006.01) |
| *H01S 3/08* | (2023.01) |
| *H01S 3/1055* | (2006.01) |
| *H01S 3/106* | (2006.01) |

(52) U.S. Cl.
CPC .......... *H01S 3/1055* (2013.01); *G03F 7/2006* (2013.01); *H01S 3/08009* (2013.01); *H01S 3/106* (2013.01)

(58) Field of Classification Search
CPC .. H01S 3/08009; H01S 3/2256; H01S 3/2251; H01S 3/225; H01S 3/08004;

(Continued)

(56) References Cited

U.S. PATENT DOCUMENTS

| | | |
|---|---|---|
| 7,154,928 B2 | 12/2006 | Sandstrom et al. |
| 2002/0154661 A1 | 10/2002 | Hoose et al. |

(Continued)

FOREIGN PATENT DOCUMENTS

| | | | | |
|---|---|---|---|---|
| DE | 4015861 A | * 11/1991 | ........... | H01S 3/0823 |
| JP | S51-031195 A | 3/1976 | | |

(Continued)

OTHER PUBLICATIONS

Machine translation of DE-4015861-A (Year: 1991).*

(Continued)

*Primary Examiner* — Steven H Whitesell
(74) *Attorney, Agent, or Firm* — Studebaker & Brackett PC

(57) ABSTRACT

A line narrowing device includes a first prism; first and second gratings arranged on the optical path of the light beam having passed through the first prism at positions different in a direction of grooves of either the first grating or the second grating; a beam adjustment optical system arranged on the optical path of the light beam between the first prism and at least one grating of the first and second gratings, and causing a first portion of the light beam to be incident on the first grating and causing a second portion of the light beam to be incident on the second grating; a first actuator adjusting an incident angle of the first portion on the first grating; a second actuator adjusting an incident angle of the second portion on the second grating; and a third actuator adjusting an energy ratio of the first and second portions.

5 Claims, 12 Drawing Sheets

(58) Field of Classification Search
CPC ........ H01S 3/104; H01S 3/0812; H01S 3/106; H01S 3/1055; G03F 7/70575; G03F 7/70025
See application file for complete search history.

(56) References Cited

U.S. PATENT DOCUMENTS

| | | |
|---|---|---|
| 2009/0135857 A1 | 5/2009 | Oh et al. |
| 2013/0215916 A1 | 8/2013 | Kakizaki et al. |
| 2014/0092932 A1* | 4/2014 | Ichihara ................. H01S 3/106 372/100 |
| 2014/0185634 A1 | 7/2014 | Ichihara et al. |
| 2018/0041000 A1 | 2/2018 | Miyamoto |

FOREIGN PATENT DOCUMENTS

| | | |
|---|---|---|
| JP | 2006269628 A * | 10/2006 |
| JP | 2007-005538 A | 1/2007 |
| JP | 2009-130351 A | 6/2009 |
| JP | 2013-062484 A | 4/2013 |
| JP | 2013-089680 A | 5/2013 |
| JP | 2014-072506 A | 4/2014 |
| WO | 2016189722 A1 | 12/2016 |
| WO | 2016189968 A1 | 12/2016 |

OTHER PUBLICATIONS

Machine translation of JP-2006269628-A (Year: 2006).*
International Search Report issued in PCT/JP2020/012542; mailed Jun. 23, 2020.
International Preliminary Report On Patentability and Written Opinion issued in PCT/JP2020/012542; mailed Jun. 23, 2020. issued Sep. 20, 2022.
International Preliminary Report on Patentability and Written Opinion issued in PCT/JP2020/012542; mailed Jun. 23, 2020.

* cited by examiner

LINE NARROWING DEVICE AND ELECTRONIC DEVICE MANUFACTURING METHOD

The present application claims the benefit of International Application No. PCT/JP2020/012542, filed on Mar. 19, 2020 the entire contents of which are hereby incorporated by reference.

BACKGROUND

1. Technical Field

The present disclosure relates to a line narrowing device and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device have a large spectral line width of about 350 to 400 pm in natural oscillation light. Therefore, when a projection lens is formed of a material through which ultraviolet rays such as KrF laser light and ArF laser light are transmitted, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing gas laser device.

LIST OF DOCUMENTS

Patent Documents

Patent Document 1: U.S. Pat. No. 7,154,928
Patent Document 2: Japanese Patent Application Publication No. S51-031195

SUMMARY

A line narrowing device according to an aspect of the present disclosure includes a first prism arranged on an optical path of a light beam; first and second gratings arranged on the optical path of the light beam having passed through the first prism at positions different in a direction of grooves of either the first grating or the second grating; a beam adjustment optical system arranged on the optical path of the light beam between the first prism and at least one grating of the first and second gratings, and configured to cause a first portion of the light beam to be incident on the first grating and to cause a second portion of the light beam to be incident on the second grating; a first actuator configured to adjust an incident angle of the first portion on the first grating; a second actuator configured to adjust an incident angle of the second portion on the second grating; and a third actuator configured to adjust an energy ratio of the first portion and the second portion by adjusting either a position or posture of at least one optical element included in the beam adjustment optical system.

A line narrowing device according to another aspect of the present disclosure includes a prism arranged on an optical path of a light beam; a beam adjustment optical system including a mirror arranged as overlapping a part of a cross section of the optical path of the light beam having passed through the prism and configured to split the light beam into a second portion reflected by the mirror and a first portion; a first grating arranged on the optical path of the first portion; a second grating arranged on the optical path of the second portion; a first actuator configured to adjust an incident angle of the first portion on the first grating; a second actuator configured to adjust an incident angle of the second portion on the second grating; and a third actuator configured to adjust an energy ratio of the first portion and the second portion.

An electronic device manufacturing method according to an aspect of the present disclosure includes generating pulse laser light using a laser device; outputting the pulse laser light to an exposure apparatus; and exposing a photosensitive substrate to the pulse laser light in the exposure apparatus to manufacture an electronic device. Here, the laser device includes a laser chamber and an optical resonator including a line narrowing device. The line narrowing device includes a first prism arranged on an optical path of a light beam; first and second gratings arranged on the optical path of the light beam having passed through the first prism at positions different in a direction of grooves of either the first grating or the second grating; a beam adjustment optical system arranged on the optical path of the light beam between the first prism and at least one grating of the first and second gratings, and configured to cause a first portion of the light beam to be incident on the first grating and to cause a second portion of the light beam to be incident on the second grating; a first actuator configured to adjust an incident angle of the first portion on the first grating; a second actuator configured to adjust an incident angle of the second portion on the second grating; and a third actuator configured to adjust an energy ratio of the first portion and the second portion by adjusting either a position or posture of at least one optical element included in the beam adjustment optical system.

BRIEF DESCRIPTION OF THE DRAWINGS

Embodiments of the present disclosure will be described below merely as examples with reference to the accompanying drawings.

DESCRIPTION OF EMBODIMENTS

Figure 1:
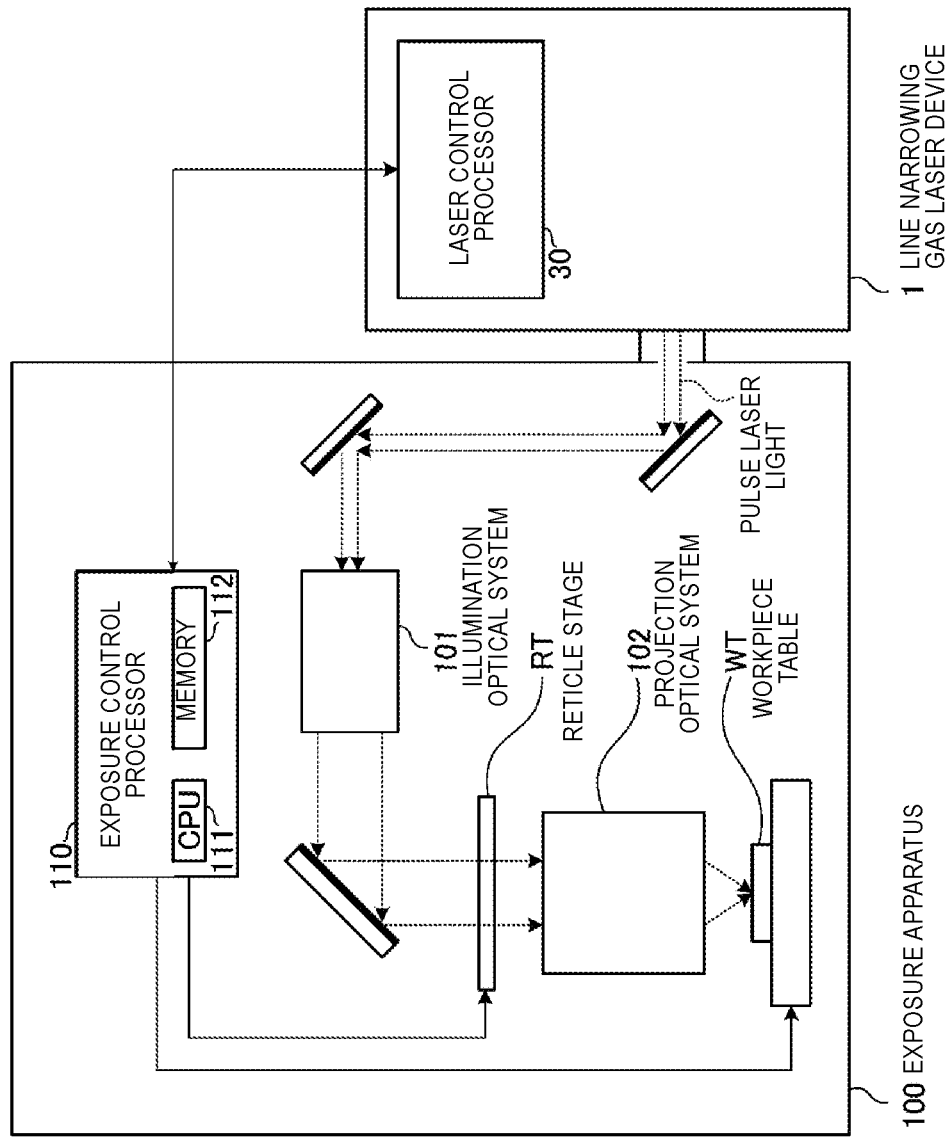
FIG. 1 schematically shows the configuration of an exposure system of a comparative example.

<Contents>
1. Comparative example
    1.1 Exposure system
        1.1.1 Configuration of exposure apparatus 100
        1.1.2 Operation
    1.2 Line narrowing gas laser device
        1.2.1 Configuration
            1.2.1.1 Master oscillator MO
            1.2.1.2 Laser control processor 30
            1.2.1.3 Gas adjustment device GA
        1.2.2 Operation
            1.2.2.1 Laser control processor 30
            1.2.2.2 Master oscillator MO
            1.2.2.3 Gas adjustment device GA
    1.3 Line narrowing device
        1.3.1 Configuration
            1.3.1.1 Prisms 41, 42
            1.3.1.2 Gratings 51, 52
        1.3.2 Operation
    1.3 Problem of comparative example
2. Line narrowing device capable of adjusting energy ratio of plurality of wavelength components
    2.1 First embodiment
        2.1.1 Configuration
        2.1.2 Operation
        2.1.3 Effect
    2.2 First modification
        2.2.1 Configuration and operation
        2.2.2 Effect
    2.3 Second modification
        2.3.1 Configuration
        2.3.2 Operation
        2.3.3 Other configuration example
        2.3.4 Effect
    2.4 Third modification
        2.4.1 Configuration
        2.4.2 Operation
        2.4.3 Other configuration example
        2.4.4 Effect
    2.5 Fourth modification
        2.5.1 Configuration
        2.5.2 Operation
        2.5.3 Other configuration example
        2.5.4 Effect
3. Line narrowing device including beam separation optical system and beam shift optical system
    3.1 Configuration
    3.2 Operation
    3.3 Other configuration example
    3.4 Effect
4. Line narrowing device performing wavelength selection of three or more wavelengths
    4.1 Configuration
        4.1.1 Plane-parallel substrates 61, 65
        4.1.2 Gratings 51 to 53
    4.2 Operation
    4.3 Other configuration example
    4.4 Effect
5. Line narrowing device splitting light beam with mirror
    5.1 Configuration and operation
        5.1.1 Beam adjustment optical system
        5.1.2 Gratings 51h, 52h
    5.2 Other configuration example
    5.3 Effect
6. Line narrowing device adjusting energy ratio by position of mirror
    6.1 Configuration
    6.2 Operation
    6.3 Other configuration example
    6.4 Effect
7. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Comparative Example 1.1 Exposure System

Figure 2:
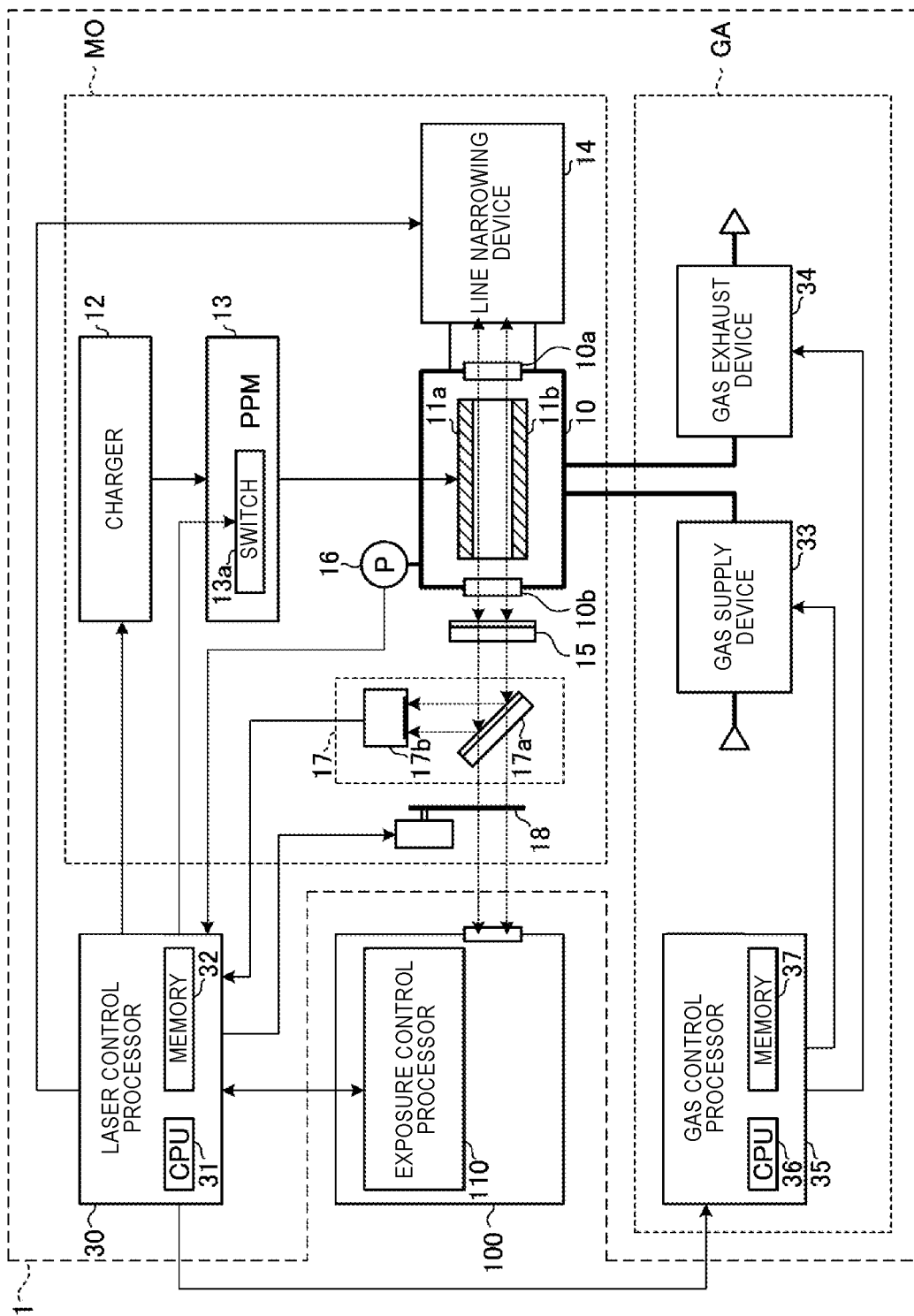
FIG. 2 schematically shows the configuration of the exposure system of the comparative example.

FIGS. 1 and 2 schematically show the configuration of an exposure system of a comparative example. The comparative example of the present disclosure is an example recognized by the applicant as known only by the applicant, and is not a publicly known example admitted by the applicant.

The exposure system includes a line narrowing gas laser device 1 and an exposure apparatus 100. In FIG. 1, the line narrowing gas laser device 1 is shown in a simplified manner. In FIG. 2, the exposure apparatus 100 is shown in a simplified manner.

The line narrowing gas laser device 1 includes a laser control processor 30. The line narrowing gas laser device 1 is configured to output pulse laser light toward the exposure apparatus 100.

1.1.1 Configuration of Exposure Apparatus 100

As shown in FIG. 1, the exposure apparatus 100 includes an illumination optical system 101, a projection optical system 102, and an exposure control processor 110.

The illumination optical system 101 illuminates a reticle pattern of a reticle (not shown) arranged on a reticle stage RT with the pulse laser light incident from the line narrowing gas laser device 1.

The projection optical system 102 causes the pulse laser light transmitted through the reticle to be imaged as being reduced and projected on a workpiece (not shown) arranged on a workpiece table WT. The workpiece is a photosensitive substrate such as a semiconductor wafer coated with a resist film.

The exposure control processor 110 is a processing device including a memory 112 in which a control program is stored, and a central processing unit (CPU) 111 which executes the control program. The exposure control processor 110 is specifically configured or programmed to perform various processes included in the present disclosure. The exposure control processor 110 controls the exposure apparatus 100, and transmits and receives various data and various signals to and from the laser control processor 30.

1.1.2 Operation

The exposure control processor 110 transmits data of a target value of the wavelength, data of a target value of the pulse energy, and a trigger signal to the laser control processor 30. The laser control processor 30 controls the line narrowing gas laser device 1 in accordance with the data and signal.

The exposure control processor 110 translates the reticle stage RT and the workpiece table WT in opposite directions in synchronization with each other. Thus, the workpiece is exposed to the pulse laser light reflecting the reticle pattern.

Through such an exposure process, the reticle pattern is transferred onto the semiconductor wafer. Thereafter, an electronic device can be manufactured through a plurality of processes.

1.2 Line Narrowing Gas Laser Device 1.2.1 Configuration

As shown in FIG. 2, in addition to the laser control processor 30, the line narrowing gas laser device 1 includes a master oscillator MO and a gas adjustment device GA.

1.2.1.1 Master Oscillator MO

The master oscillator MO includes a laser chamber 10, a charger 12, a pulse power module (PPM) 13, a line narrowing device 14, an output coupling mirror 15, a photodetector 17, and a shutter 18. The line narrowing device 14 and the output coupling mirror 15 configure an optical resonator.

The laser chamber 10 is arranged on the optical path of the optical resonator. The laser chamber 10 is provided with two windows 10a, 10b.

The laser chamber 10 includes a pair of electrodes 11a, 11b therein, and further accommodates laser gas as a laser medium. The laser medium is, for example, $F_2$, ArF, KrF, XeCl, or XeF. A pressure sensor 16 is attached to the laser chamber 10.

The charger 12 holds electric energy to be supplied to the pulse power module 13. The pulse power module 13 includes a switch 13a.

The line narrowing device 14 includes wavelength selection elements such as prisms 41, 42 and gratings 51, 52, which will be described later. The output coupling mirror 15 is configured by a partial reflection mirror.

The photodetector 17 includes a beam splitter 17a and a sensor unit 17b. The beam splitter 17a is arranged on the optical path of the pulse laser light output from the output coupling mirror 15. The beam splitter 17a is configured to cause a part of the pulse laser light to be transmitted therethrough at high transmittance and to reflect another part of the pulse laser light to be incident on the sensor unit 17b. The sensor unit 17b includes a spectral sensor and is configured to be capable of outputting the measurement data of the wavelength. Further, the sensor unit 17b includes an energy sensor and is configured to be capable of outputting the measurement data of the pulse energy.

The shutter 18 is arranged on the optical path of the pulse laser light transmitted through the beam splitter 17a. When the shutter 18 is closed, the pulse laser light transmitted through the beam splitter 17a is blocked so as not to enter the exposure apparatus 100. When the shutter 18 is open, the pulse laser light transmitted through the beam splitter 17a enters the exposure apparatus 100 without being blocked.

1.2.1.2 Laser Control Processor 30

The laser control processor 30 is a processing device including a memory 32 in which a control program is stored and a CPU 31 for executing the control program. The laser control processor 30 is specifically configured or programmed to perform various processes included in the present disclosure.

1.2.1.3 Gas Adjustment Device GA

The gas adjustment device GA includes a gas supply device 33, a gas exhaust device 34, and a gas control processor 35.

The gas supply device 33 includes a valve (not shown) provided at a first pipe between the laser chamber 10 and a gas cylinder (not shown).

The gas exhaust device 34 includes a valve (not shown) provided at the second pipe connected to the laser chamber 10, a pump (not shown), and a detoxification device (not shown).

The gas control processor 35 is a processing device including a memory 37 in which a control program is stored and a CPU 36 for executing the control program. The gas control processor 35 is specifically configured or programmed to perform various processes included in the present disclosure.

1.2.2 Operation 1.2.2.1 Laser Control Processor 30

The laser control processor 30 acquires data of the target value of the wavelength from the exposure control processor 110. The laser control processor 30 transmits an initial setting signal to the line narrowing device 14 based on the target value of the wavelength. After outputting of the pulse laser light is started, the laser control processor 30 receives the measurement data of the wavelength from the photodetector 17 and transmits a feedback control signal to the line narrowing device 14 based on the target value of the wavelength and the measurement data of the wavelength.

The laser control processor 30 acquires data of the target value of the pulse energy from the exposure control processor 110. The laser control processor 30 transmits an initial setting signal of the charge voltage to the charger 12 based on the target value of the pulse energy. After outputting of the pulse laser light is started, the laser control processor 30 receives the measurement data of the pulse energy from the photodetector 17 and transmits a feedback control signal of the charge voltage to the charger 12 based on the target value of the pulse energy and the measurement data of the pulse energy.

The laser control processor 30 receives a trigger signal from the exposure control processor 110. The laser control processor 30 transmits an oscillation trigger signal based on the trigger signal to the switch 13a of the pulse power module 13.

The laser control processor 30 transmits a gas control signal to the gas control processor 35. Further, the laser control processor 30 receives the measurement data of the gas pressure P from the pressure sensor 16 and transmits the measurement data of the gas pressure P to the gas control processor 35.

1.2.2.2 Master Oscillator MO

The switch 13a is turned on when the oscillation trigger signal is received from the laser control processor 30. When the switch 13a is turned on, the pulse power module 13 generates a high pulse voltage from the electric energy held in the charger 12. The pulse power module 13 applies the high voltage between the electrodes 11a, 11b.

When the high voltage is applied between the electrodes 11a, 11b, discharge occurs between the electrodes 11a, 11b.

The laser gas in the laser chamber 10 is excited by the energy of the discharge and shifts to a high energy level. When the excited laser gas then shifts to a low energy level, light having a wavelength corresponding to the difference between the energy levels is emitted.

The light generated in the laser chamber 10 is output to the outside of the laser chamber 10 through the windows 10a, 10b. The light output from the window 10a enters the line narrowing device 14 as a light beam. The light in the vicinity of the desired wavelength among the light having entered the line narrowing device 14 is fed back by the line narrowing device 14 and returned to the laser chamber 10.

The output coupling mirror 15 causes a part of the light output from the window 10b to be transmitted therethrough and output therefrom, and causes another part thereof to be reflected back into the laser chamber 10.

In this way, the light output from the laser chamber 10 reciprocates between the line narrowing device 14 and the output coupling mirror 15. The light is amplified every time when passing through a discharge space between the pair of discharge electrodes 11a, 11b. Thus, the light having undergone laser oscillation and line narrowing is output as pulse laser light from the output coupling mirror 15.

The pulse laser light output from the line narrowing gas laser device 1 enters the exposure apparatus 100.

1.2.2.3 Gas Adjustment Device GA

The gas control processor 35 controls the gas supply device 33 and the gas exhaust device 34 so that the gas pressure P inside the laser chamber 10 becomes a desired value based on the gas control signal and the measurement data of the gas pressure P received from the laser control processor 30.

For example, when increasing the gas pressure P inside the laser chamber 10, the gas control processor 35 performs control to open the valve included in the gas supply device 33 so that the laser gas is supplied into the laser chamber 10. Also, for example, when decreasing the gas pressure P inside the laser chamber 10, the gas control processor 35 performs control to open the valve included in the gas exhaust device 34 so that a part of the laser gas inside the laser chamber 10 is exhausted.

1.3 Line Narrowing Device
1.3.1 Configuration

Figure 3A:
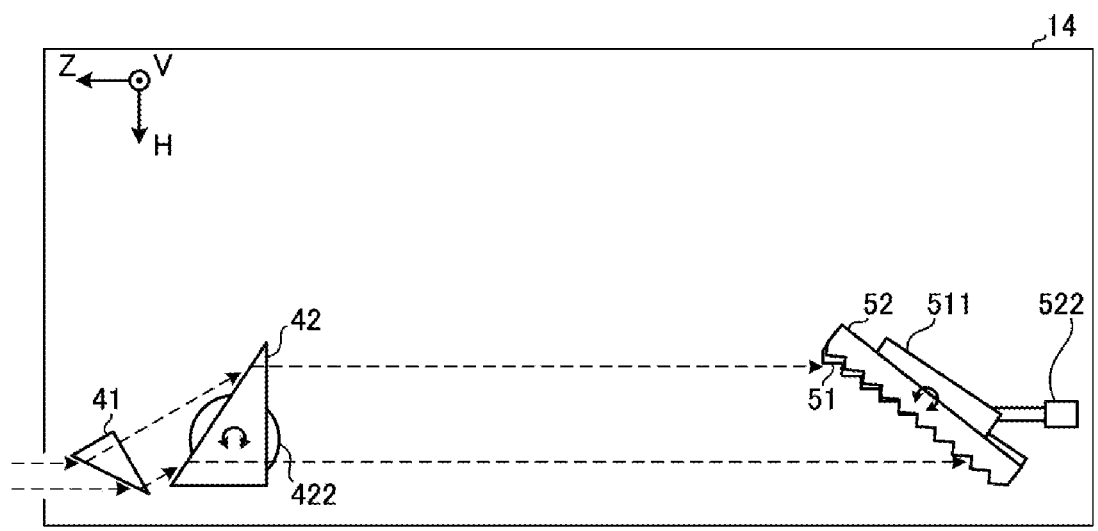
FIGS. 3A and 3B schematically show the configuration of a line narrowing device of the comparative example.
Figure 3B:
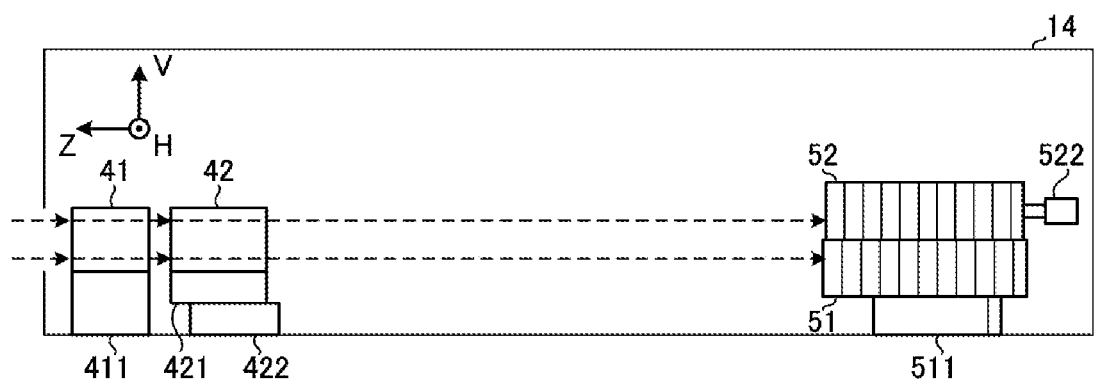

FIGS. 3A and 3B schematically show the configuration of the line narrowing device 14 of the comparative example. In each figure, the V axis, the H axis, and the Z axis perpendicular to each other are shown. FIG. 3A shows the line narrowing device 14 viewed in the −V direction, and FIG. 3B shows the line narrowing device 14 viewed in the −H direction. The −V direction and the +V direction coincide with a direction in which the electrodes 11a, 11b (see FIG. 2) face each other. The −Z direction coincides with the travel direction of the light beam output from the window 10a. The +Z direction coincides with the travel direction of the pulse laser light output from the window 10b and output via the output coupling mirror 15.

The line narrowing device 14 includes the prisms 41, 42 and the gratings 51, 52.

1.3.1.1 Prisms 41, 42

The prism 41 is arranged on the optical path of the light beam output from the window 10a. The prism 41 is supported by a holder 411.

The prism 42 is arranged on the optical path of the light beam having passed through the prism 41. The prism 42 corresponds to the first prism in the present disclosure. The prism 42 is supported by a holder 421.

The prisms 41, 42 are made of a material such as calcium fluoride and synthetic quartz having high transmittance for the wavelength selected by the line narrowing device 14

The prisms 41, 42 are arranged such that the surfaces of the prisms 41, 42 which the light beam is incident on and output are parallel to the V axis. The prism 42 is rotatable about an axis parallel to the V axis by a rotation stage 422.

1.3.1.2 Gratings 51, 52

The gratings 51, 52 are arranged at positions different from each other in the V-axis direction on the optical path of the light beam having passed through the prism 42. The grating 51 corresponds to the first grating in the present disclosure, and the grating 52 corresponds to the second grating in the present disclosure. The directions of the grooves of the respective gratings 51, 52 coincide with the V-axis direction. The positions of the gratings 51, 52 are set such that the light beam having passed through the prism 42 is incident on across the gratings 51, 52.

The gratings 51, 52 are supported by a holder 511. However, while the grating 51 is supported to maintain constant posture, the grating 52 is rotatable about an axis parallel to the V axis by a rotation mechanism 522.

1.3.2 Operation

The travel direction of the light beam output from the window 10a is changed in a plane parallel to the HZ plane which is a plane perpendicular to the V axis by each of the prisms 41, 42, and the beam width thereof is expanded in the plane parallel to the HZ plane. For example, the travel direction of the light beam having passed through both the prisms 41, 42 toward the gratings 51, 52 substantially coincides to −Z direction.

The light incident on the gratings 51, 52 from the prism 42 is reflected by the plurality of grooves of each of the gratings 51, 52 and is diffracted in a direction corresponding to the wavelength of the light. As a result, the light reflected by the plurality of grooves of each of the gratings 51, 52 is dispersed in the plane parallel to the HZ plane. The grating 51 is arranged in the Littrow arrangement, which causes the incident angle of the light beam incident on the grating 51 from the prism 42 to coincide with the diffraction angle of the diffracted light having a desired first wavelength. The grating 52 is arranged in the Littrow arrangement, which causes the incident angle of the light beam incident on the grating 52 from the prism 42 to coincide with the diffraction angle of the diffracted light having a desired second wavelength. When the incident angles of the light beams incident on the gratings 51, 52 from the prism 42 are different from each other, a wavelength difference occurs between the first wavelength of the diffracted light returned from the grating 51 to the prism 42 and the second wavelength of the diffracted light returned from the grating 52 to the prism 42.

In FIGS. 3A and 3B, broken-line arrows indicating light beams show only the direction from the prism 41 toward the gratings 51, 52, but the light beams having wavelengths selected by the line narrowing device 14 travel from the gratings 51, 52 toward the prism 41 along paths opposite to the broken line arrows.

The prisms 42, 41 reduce the beam width of the light returned from the gratings 51, 52 in the plane parallel to the HZ plane, and return the light into the laser chamber 10 through the window 10a.

The rotation stage 422 and the rotation mechanism 522 are controlled by the laser control processor 30 (see FIG. 2).

When the rotation stage 422 slightly rotates the prism 42, the travel direction of the light beam output from the prism 42 toward the gratings 51, 52 slightly changes in the plane parallel to the HZ plane. Thus, the incident angles of the light beams incident on the gratings 51, 52 from the prism 42 slightly change.

Therefore, both the first wavelength and the second wavelength are changed. When the rotation mechanism 522 slightly rotates the grating 52, the incident angle of the light beam incident on the grating 51 from the prism 42 does not change, but the incident angle of the light beam incident on the grating 52 from the prism 42 slightly changes. Thus, the wavelength difference between the first wavelength and the second wavelength changes.

With the above configuration and operation, the light beams having the first wavelength and the second wavelength output from the window 10a of the laser chamber 10 are selected and returned to the laser chamber 10. Thus, the line narrowing gas laser device 1 can perform two-wavelength oscillation. By controlling the rotation stage 422 and the rotation mechanism 522, it is also possible to separately set the first wavelength and the second wavelength.

The focal length in the exposure apparatus 100 (see FIG. 1) depends on the wavelength of the pulse laser light. The pulse laser light output from the line narrowing gas laser device 1 through two-wavelength oscillation can be imaged, on the workpiece table WT of the exposure apparatus 100, at two positions different in the direction of the optical path axis of the pulse laser light, and the depth of focus can be substantially increased. For example, even when a resist film having a large thickness is to be exposed, it is possible to suppress variations in imaging performance in the thickness direction of the resist film.

1.3 Problem of Comparative Example

In the comparative example, the first wavelength and the second wavelength can be set separately, but there are cases that it is not easy to form the cross sectional shape of the resist film obtained by exposing and developing the resist film into a desired shape. For example, even when it is desirable that a resist wall surface, which is a boundary surface between a portion where the resist film is removed by exposure and development and a portion where the resist film remains on the semiconductor wafer, is close to being perpendicular to the surface of the semiconductor wafer, the resist wall surface may become oblique.

In some embodiments described below, it is possible to adjust the energy ratio of the first wavelength component and the second wavelength component included in the pulse laser light. By making the energy ratio adjustable, the balance of the exposure state in the thickness direction of the resist film can be adjusted.

2. Line Narrowing Device Capable of Adjusting Energy Ratio of Plurality of Wavelength Components

2.1 First Embodiment 2.1.1 Configuration

Figure 4A:
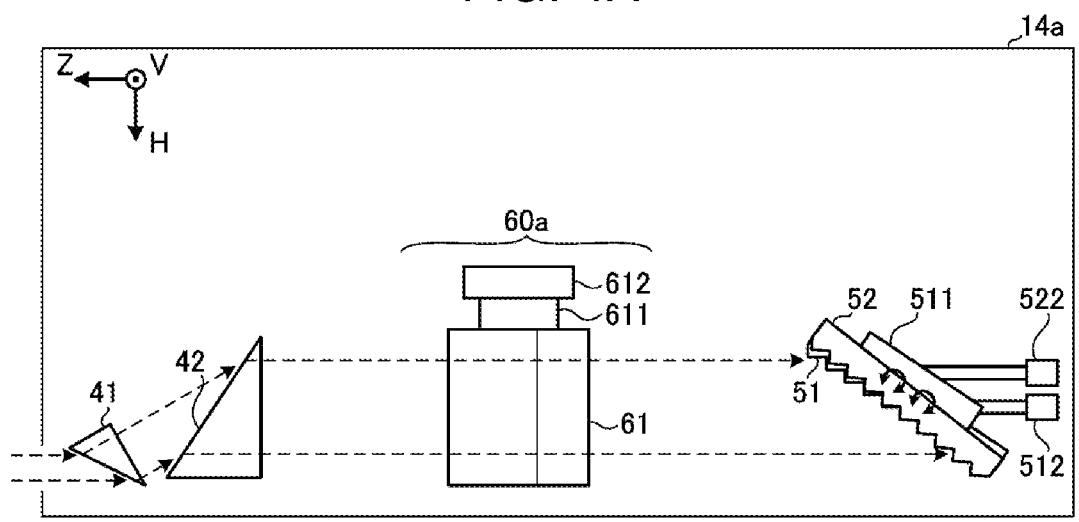
FIGS. 4A to 4C schematically show the configuration of the line narrowing device of a first embodiment.
Figure 4B:
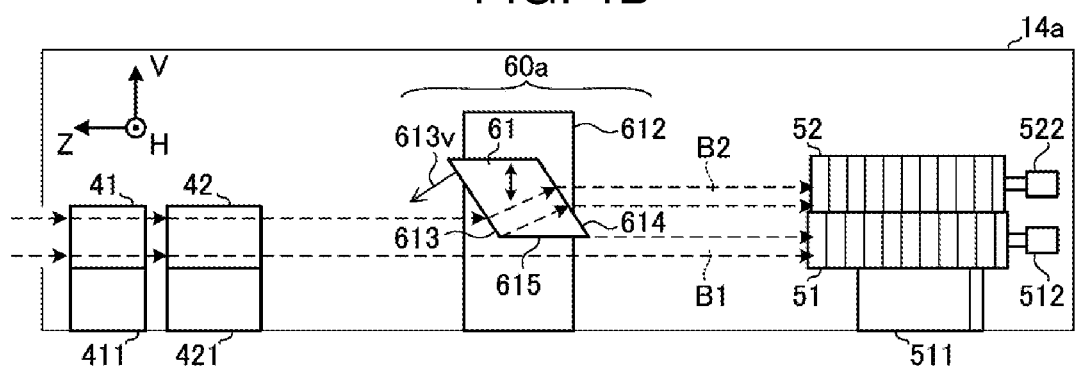
Figure 4C:
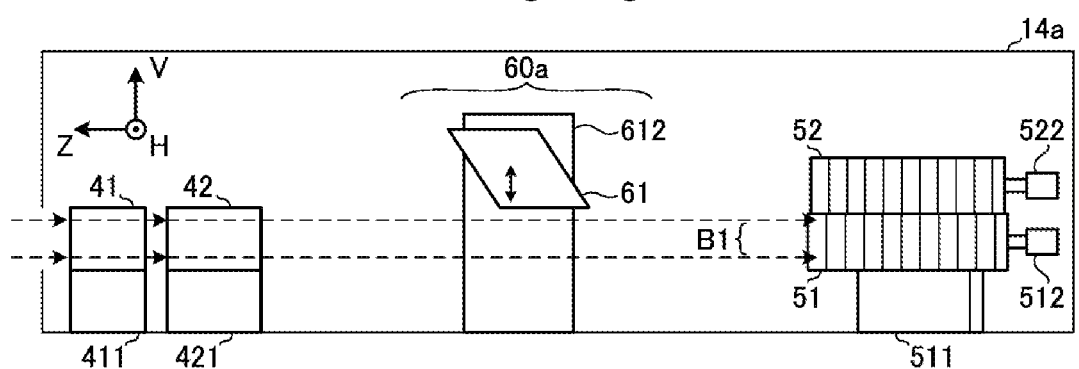

FIGS. 4A to 4C schematically show the configuration of a line narrowing device 14a of a first embodiment. FIG. 4A shows the line narrowing device 14a viewed in the −V direction, and FIGS. 4B and 4C show the line narrowing device 14a viewed in the −H direction.

The line narrowing device 14a includes a beam separation optical system 60a as a beam adjustment optical system. The beam separation optical system 60a includes a plane-parallel substrate 61.

The plane-parallel substrate 61 is arranged so as to overlap with a part of the cross section of the optical path of the light beam having passed through the prism 42. The plane-parallel substrate 61 is arranged on the optical path of the light beam between the prism 42 and the grating 52. The plane-parallel substrate 61 is supported by a holder 611. The plane-parallel substrate 61 is made of a material such as calcium fluoride and synthetic quartz. The plane-parallel substrate 61 is configured to be movable in the −V direction and the +V direction by a linear stage 612. In the first embodiment, the linear stage 612 corresponds to the third actuator in the present disclosure.

The plane-parallel substrate 61 includes an incidence surface 613 on which a part of the light beam having passed through the prism 42 is incident, and an exit surface 614 from which the light incident on the plane-parallel substrate 61 through the incidence surface 613 is output toward the grating 52 from the inside of the plane-parallel substrate 61 (see FIG. 4B). The incidence surface 613 and the exit surface 614 are both parallel to the H axis and parallel to each other. The incidence surface 613 and the exit surface 614 are inclined with respect to the incident direction of the light beam so as to refract the light beam. Specifically, a normal line vector 613v of the incidence surface 613 is parallel to the VZ plane, and further, the normal line vector 613v has direction components in the −V direction and the +Z direction.

The plane-parallel substrate 61 further includes an end surface 615 facing a first portion B1 of the light beam. The end surface 615 forms an acute angle with the exit surface 614. The angle formed by the exit surface 614 and the end surface 615 is preferably 70° or less. The end surface 615 may be parallel to the HZ plane.

The gratings 51, 52 are rotatable by the rotation mechanisms 512, 522, respectively. That is, the rotation mechanism 512 rotates the grating 51 about an axis parallel to the V axis, and the rotation mechanism 522 rotates the grating 52 about an axis parallel to the V axis. In the first embodiment, the rotation mechanism 512 corresponds to the first actuator in the present disclosure, and the rotation mechanism 522 corresponds to the second actuator in the present disclosure.

The prism 42 may be supported by the holder 421 so as to maintain constant posture. That is, the prism 42 may not be rotatable by an actuator.

2.1.2 Operation

The first portion B1 of the light beam having passed through the prism 42 passes through the outside of the plane-parallel substrate 61 and is incident on the grating 51. A second portion B2 of the light beam passes through the inside of the plane-parallel substrate 61 and is incident on the grating 52. That is, the beam separation optical system 60a causes the first portion B1 of the light beam to be incident on the grating 51 and the second portion B2 of the light beam to be incident on the grating 52. At this time, the plane-parallel substrate 61 shifts the optical path axis of the second portion B2 of the light beam in the +V direction with respect to the optical path axis of the first portion B1. The optical path axis refers to the center axis of the optical path. Thus, the plane-parallel substrate 61 separates the second portion B2 of the light beam from the first portion B1 by causing a part of the light beam to be transmitted therethrough.

Further, when the linear stage 612 changes the position of the plane-parallel substrate 61 in the V-axis direction, the energy ratio of the first portion B1 and the second portion B2 is changed.

When the second portion B2 of the light beam incident on the plane-parallel substrate 61 is increased by moving the plane-parallel substrate 61 in the −V direction, the amount of light incident on the grating 52 increases. Therefore, the energy of the wavelength component of the second wavelength included in the pulse laser light increases.

When the second portion B2 of the light beam incident on the plane-parallel substrate 61 is decreased by moving the plane-parallel substrate 61 in the +V direction, the amount of light incident on the grating 52 decreases. Therefore, the energy of the wavelength component of the second wavelength included in the pulse laser light decreases. The movement direction of the plane-parallel substrate 61 by the linear stage 612 may not be the V-axis direction.

The linear stage 612 may move the plane-parallel substrate 61 in a direction intersecting with the HZ plane which is a plane perpendicular to the V axis.

The exposure control processor 110 (see FIG. 2) transmits a target value of the first wavelength, a target value of the second wavelength, and a target value of the energy ratio to the laser control processor 30.

The laser control processor 30 controls the rotation mechanism 512 based on the target value of the first wavelength. Thus, the rotation mechanism 512 changes the posture of the grating 51 and adjusts the incident angle (first incident angle) of the first portion B1 of the light beam with respect to the grating 51.

The laser control processor 30 controls the rotation mechanism 522 based on the target value of the second wavelength. Thus, the rotation mechanism 522 changes the posture of the grating 52 and adjusts the incident angle (second incident angle) of the second portion B2 of the light beam with respect to the grating 52.

The laser control processor 30 controls the linear stage 612 based on the target value of the energy ratio. Thus, the linear stage 612 adjusts the position of the plane-parallel substrate 61, and adjusts the energy ratio of the first portion B1 and the second portion B2 of the light beam.

As shown in FIG. 4C, the linear stage 612 may set the energy ratio of the second portion B2 to the first portion B1 to 0 by retracting the plane-parallel substrate 61 from the optical path of the light beam. That is, the entire light beam may be incident on the grating 51 as the first portion B1.

In the examples shown in FIGS. 4A to 4C, the grating 51 and the grating 52 are arranged with substantially no space therebetween, but the present disclosure is not limited thereto. There may be a space between the grating 51 and the grating 52 that is smaller than the space between the first portion B1 and the second portion B2 of the light beam.

2.1.3 Effect

In the first embodiment, the energy ratio of the first portion B1 and the second portion B2 of the light beam is adjusted by adjusting the position of the plane-parallel substrate 61 which is at least one of the optical elements included in the beam adjustment optical system. Thus, it is possible to adjust the energy ratio of the first wavelength component and the second wavelength component included in the pulse laser light output from the line narrowing gas laser device 1. By exposing the resist film using the pulse laser light, the cross section shape of the resist film can be formed into a desired shape.

In the first embodiment, the rotation mechanism 512, which is the first actuator, rotates the grating 51 about an axis parallel to the grooves of the grating 51. The axis parallel to the grooves of the grating 51 is the V axis. Thus, the first incident angle of the first portion B1 of the light beam on the grating 51 is adjusted, and the first wavelength can be controlled.

In the first embodiment, the rotation mechanism 522, which is the second actuator, rotates the grating 52 about an axis parallel to the grooves of the grating 52. The axis parallel to the grooves of the grating 52 is the V axis. Thus, the second incident angle of the second portion B2 of the light beam on the grating 52 is adjusted, and the second wavelength can be controlled.

In the first embodiment, the beam adjustment optical system includes the beam separation optical system 60a. The beam separation optical system 60a is arranged so as to overlap with a part of the cross section of the optical path of the light beam, and separates the second portion B2 of the light beam from the first portion B1 by causing a part of the light beam to be transmitted therethrough. Thus, it is possible to prevent the light beam from being incident on a boundary portion between the grating 51 and the grating 52. Since the boundary portion between the grating 51 and the grating 52 may have a low diffraction efficiency, the first embodiment may mitigate a decrease in the diffraction efficiency.

Further, in the beam separation optical system 60a, the linear stage 612, which is the third actuator, changes the position of the plane-parallel substrate 61, which is at least one of the optical elements included in the beam separation optical system 60a, thereby changing the energy ratio of the first portion B1 and the second portion B2. Thus, it is possible to adjust the energy ratio of the first wavelength component and the second wavelength component included in the pulse laser light output from the line narrowing gas laser device 1.

In the first embodiment, the beam separation optical system 60a includes the plane-parallel substrate 61, and the linear stage 612, which is the third actuator, moves the plane-parallel substrate 61 in the direction intersecting with the HZ plane perpendicular to the grooves of the grating 51 or 52. By using the plane-parallel substrate 61, it is possible to suppress the change in the wavefront of the light beam. Further, by moving the plane-parallel substrate 61 in the direction in which the linear stage 612 intersects with the HZ plane, it is possible to change the energy ratio of the first portion B1 and the second portion B2.

In the first embodiment, the linear stage 612, which is the third actuator, can set the energy ratio of the second portion B2 to the first portion B1 of the light beam to 0 by retracting the plane-parallel substrate 61 from the optical path of the light beam. Thus, it is possible to perform switching from laser oscillation in the two-wavelength mode to laser oscillation in the single-wavelength mode.

In the first embodiment, the plane-parallel substrate 61 includes the exit surface 614 from which the second portion B2 of the light beam exits from the inside of the plane-parallel substrate 61 toward the grating 52, and the end surface 615 facing the first portion B1 of the light beam and forming an acute angle with the exit surface 614. Owing to that the exit surface 614 and the end surface 615 forms an acute angle, it is possible to suppress the second portion B2 incident on the plane-parallel substrate 61 through the incidence surface 613 from being incident on the end surface 615 and being wasted.

2.2 First Modification

2.2.1 Configuration and Operation

Figure 5A:
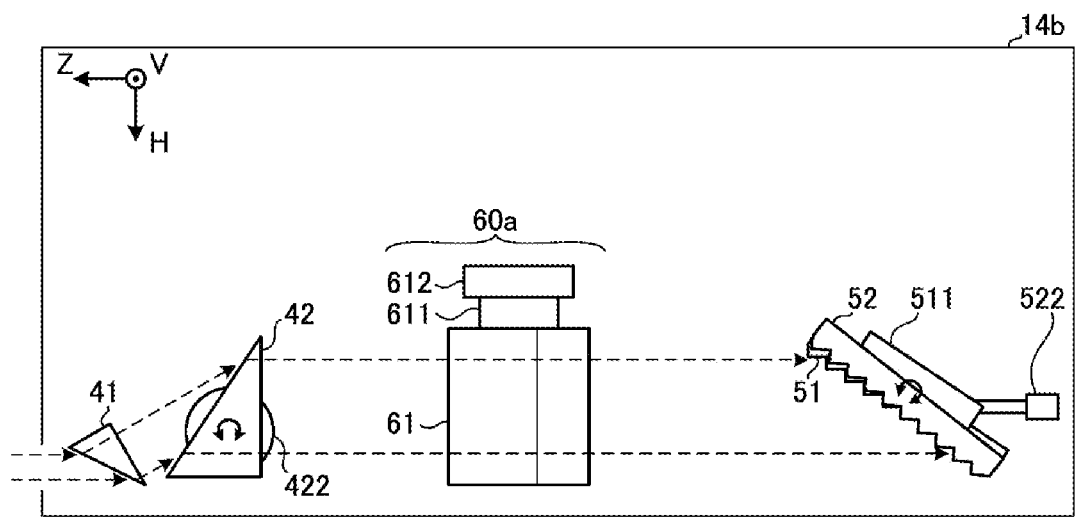
FIGS. 5A and 5B schematically show the configuration of the line narrowing device of a first modification.
Figure 5B:
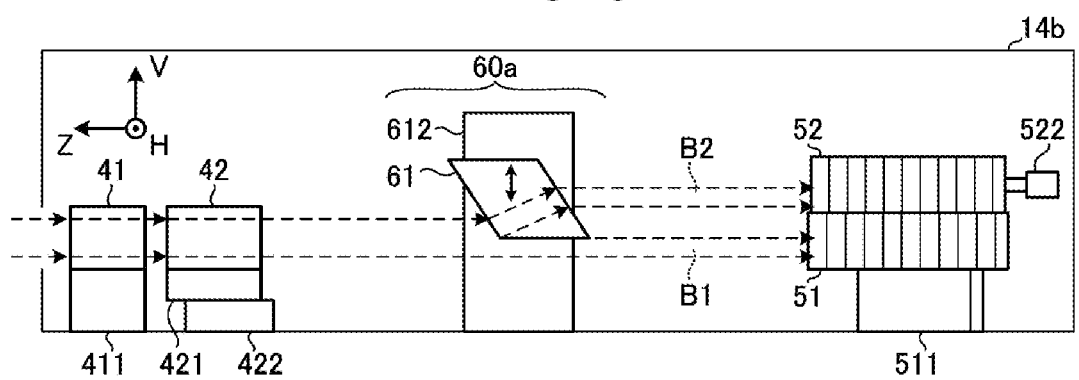

FIGS. 5A and 5B schematically show the configuration of a line narrowing device 14b of a first modification. FIG. 5A shows the line narrowing device 14b viewed in the −V direction, and FIG. 5B shows the line narrowing device 14b viewed in the −H direction.

In the line narrowing device 14b, the prism 42 is rotatable about an axis parallel to the V axis by the rotation stage 422. In the first modification, the rotation stage 422 corresponds to the first actuator in the present disclosure. In the line narrowing device 14b, the grating 51 is supported to maintain constant posture, and the grating 52 is rotatable about an axis parallel to the V axis by the rotation mechanism 522.

The configuration and operation of the prism 42 and the grating 51 are similar to the corresponding configuration and operation in the comparative example described with reference to FIGS. 3A and 3B.

In other respects, the configuration and operation of the first modification are similar to the corresponding configuration and operation in the first embodiment described with reference to FIGS. 4A to 4C.

2.2.2 Effect

In the first modification, the rotation stage 422, which is the first actuator, rotates the prism 42. Thus, the incident angles of the light beams incident on the gratings 51, 52 from the prism 42 change. Therefore, both the first wavelength and the second wavelength are changed. Further, by rotating the grating 52 by the rotation mechanism 522, the second wavelength can be changed, and the wavelength difference between the first wavelength and the second wavelength can be changed.

2.3 Second Modification

2.3.1 Configuration

Figure 6A:
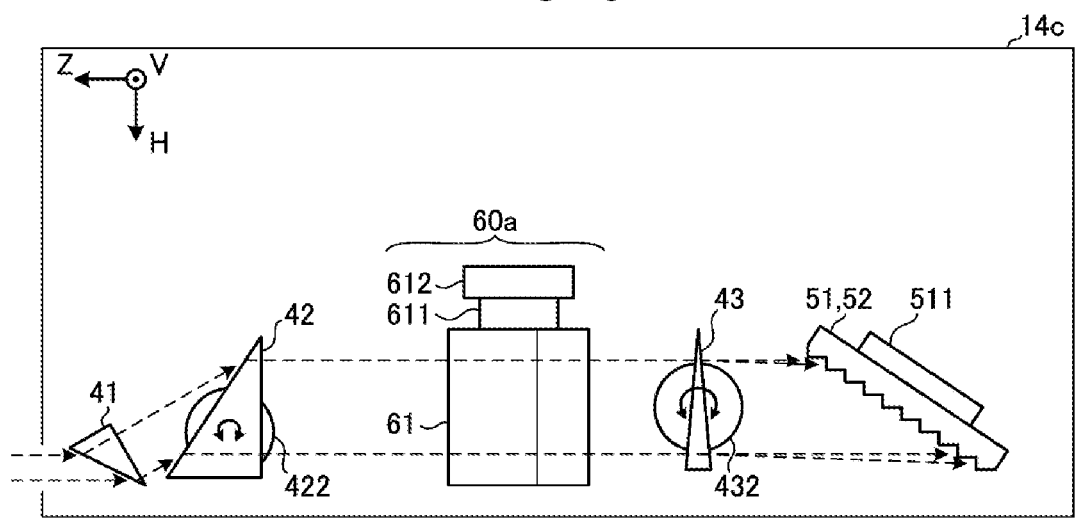
FIGS. 6A and 6B schematically show the configuration of the line narrowing device of a second modification.
Figure 6B:
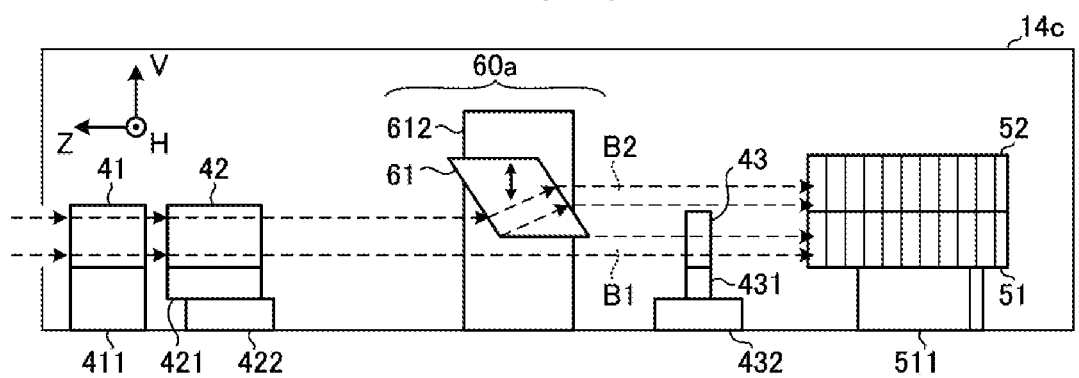

FIGS. 6A and 6B schematically show the configuration of a line narrowing device 14c of a second modification. FIG. 6A shows the line narrowing device 14c viewed in the −V direction, and FIG. 6B shows the line narrowing device 14c viewed in the −H direction.

The line narrowing device 14c includes a prism 43.

The prism 43 is arranged on the optical path of the first portion B1 separated from the second portion B2 by the beam separation optical system 60a. The prism 43 is supported by a holder 431.

The prism 43 is made of a material such as calcium fluoride and synthetic quartz.

The prism 43 has a shape of an isosceles triangle when viewed in the −V direction. The prism 43 is arranged such that the surfaces of the prism 43 which the first portion B1 of the light beam is incident on and output from are parallel to the V axis. The prism 43 is rotatable about an axis parallel to the V axis by a rotation stage 432.

The prism 43 of the second modification corresponds to the second prism in the present disclosure, and the rotation stage 432 of the second modification corresponds to the first actuator in the present disclosure.

Each of the gratings 51, 52 is supported by a holder 511 so as to maintain constant posture. That is, either or both of the rotation mechanism for rotating the grating 51 and the rotation mechanism for rotating the grating 52 may not be provided.

In other respects, the configuration of the second modification is similar to that of the first modification.

2.3.2 Operation

The first portion B1 of the light beam having passed through the prism 42 passes through the outside of the plane-parallel substrate 61 and is incident on the prism 43. When the first portion B1 is incident on the prism 43, the first portion B1 is transmitted through the prism 43 with the travel direction thereof changed in the plane parallel to the HZ plane. Thereafter, the first portion B1 is incident on the grating 51.

The second portion B2 of the light beam having passed through the prism 42 passes through the inside of the plane-parallel substrate 61. After the second portion B2 is separated from the first portion B1 by the plane-parallel substrate 61, the second portion B2 is incident on the grating 52 without changing the travel direction thereof in the plane parallel to the HZ plane.

Thus, a difference occurs between the incident angle of the first portion B1 on the grating 51 and the incident angle of the second portion B2 on the grating 52. Therefore, a wavelength difference occurs between the first wavelength of the diffracted light returned from the grating 51 to the prism 42 and the second wavelength of the diffracted light returned from the grating 52 to the prism 42.

The rotation stage 432 is controlled by the laser control processor 30 (see FIG. 2).

When the rotation stage 432 slightly rotates the prism 43, the travel direction of the first portion B1 of the light beam output from the prism 43 toward the grating 51 slightly changes in the plane parallel to the HZ plane. Thus, the incident angle of the first portion B1 of the light beam incident on the grating 51 from the prism 43 changes. In this case, the second wavelength does not change, but the first wavelength changes.

When the rotation stage 422 is driven to slightly rotate the prism 42, the travel direction of the light beam output from the prism 42 toward the gratings 51, 52 slightly changes in the plane parallel to the HZ plane. Thus, the incident angles of the light beams incident on the gratings 51, 52 from the prism 42 change. Therefore, both the first wavelength and the second wavelength are changed.

With the above configuration and operation, the line narrowing gas laser device 1 can perform two-wavelength oscillation, and it is also possible to set the first wavelength and the second wavelength separately.

In other respects, the operation of the second modification is similar to that of the first modification.

2.3.3 Other Configuration Example

In the second modification, the prism 42 is rotatable while the gratings 51, 52 are each maintained at constant posture, but the present disclosure is not limited thereto. In the second modification, the grating 52 may be rotatable while the grating 51 and the prism 42 are each maintained at constant posture. In this case, the second wavelength can be controlled by rotating the grating 52, and the first wavelength can be controlled by rotating the prism 43.

2.3.4 Effect

In the second modification, the line narrowing device 14c includes the prism 43 arranged on the optical path of the first portion B1 of the light beam, and the rotation stage 432, which is the first actuator, rotates the prism 43. Thus, it is possible to control the first wavelength separately from the second wavelength.

2.4 Third Modification

2.4.1 Configuration

Figure 7A:
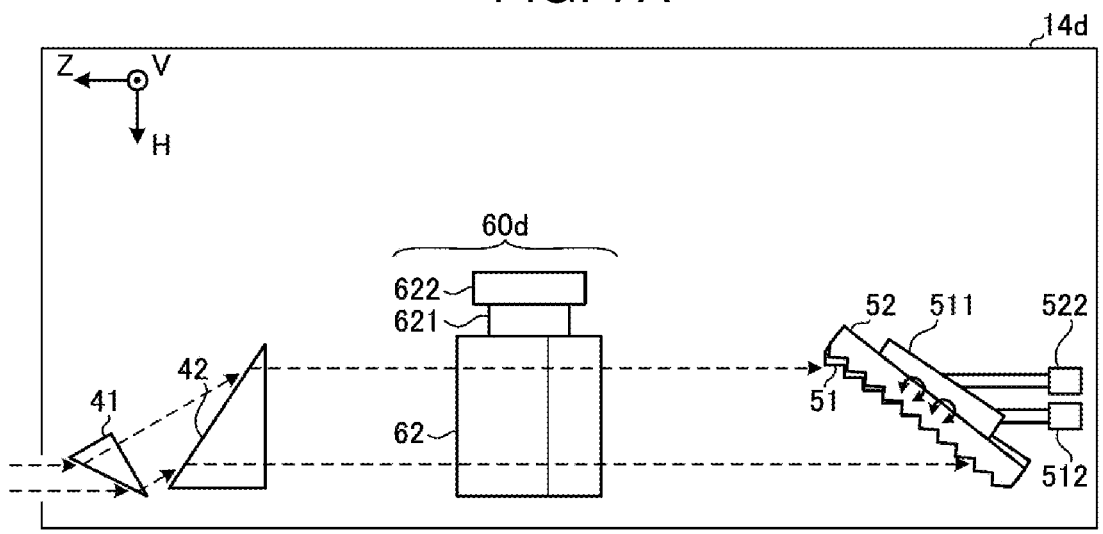
FIGS. 7A and 7B schematically show the configuration of the line narrowing device of a third modification.
Figure 7B:
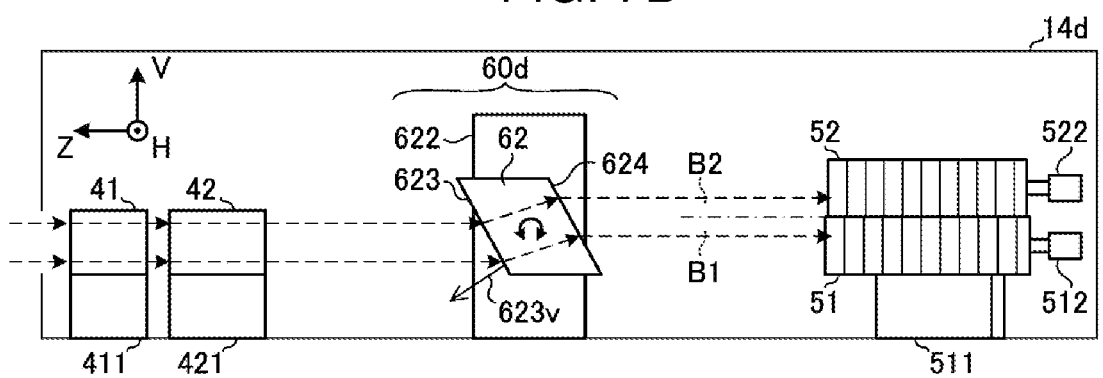

FIGS. 7A and 7B schematically show the configuration of a line narrowing device 14d of a third modification. FIG. 7A shows the line narrowing device 14d viewed in the −V direction, and FIG. 7B shows the line narrowing device 14d viewed in the −H direction.

The line narrowing device 14d includes a beam shift optical system 60d in place of the beam separation optical system 60a as the beam adjustment optical system. The beam shift optical system 60d includes a plane-parallel substrate 62.

The plane-parallel substrate 62 is arranged on the optical path of the light beam having passed through the prism 42. The plane-parallel substrate 62 is supported by a holder 621. The plane-parallel substrate 62 is made of a material such as calcium fluoride and synthetic quartz. The plane-parallel substrate 62 is configured to be rotatable about an axis parallel to the H-axis by a rotation stage 622. In the third modification, the rotation stage 622 corresponds to the third actuator in the present disclosure.

The plane-parallel substrate 62 may not be movable by a linear stage.

The plane-parallel substrate 62 includes an incidence surface 623 on which the light beam having passed through the prism 42 is incident, and an exit surface 624 from which the light incident on the plane-parallel substrate 62 through the incidence surface 623 is output toward the gratings 51, 52 from the inside of the plane-parallel substrate 62. The incidence surface 623 and the exit surface 624 are both parallel to the H axis and parallel to each other.

In other respects, the configuration of the third modification is similar to that of the first embodiment. Here, it is desirable that the grating 51 and the grating 52 are arranged with substantially no space therebetween.

2.4.2 Operation

The plane-parallel substrate 62 causes the light beam to be transmitted therethrough and incident across the gratings 51, 52. That is, the plane-parallel substrate 62 does not separate the light beam into the first portion B1 and the second portion B2, but the first portion B1 incident on the grating 51 from the plane-parallel substrate 62 and the second portion B2 incident on the grating 52 from the plane-parallel substrate 62 are integrated. The first incident angle of the first portion B1 on the grating 51 is adjusted by the rotation mechanism 512. The second incident angle of the second portion B2 on the grating 52 is adjusted by the rotation mechanism 522.

When the incidence surface 623 of the plane-parallel substrate 62 is inclined with respect to the incident direction of the light beam, the plane-parallel substrate 62 shifts the optical path axis of the light beam. In the third modification, a normal line vector 623v of the incidence surface 623 is parallel to the VZ plane, and further, the normal line vector 623v has direction components in the −V direction and the +Z direction. In this case, the optical path axis of the light beam incident on the incidence surface 623 and output from the exit surface 624 is shifted in the +V direction.

When the rotation stage 622 rotates the plane-parallel substrate 62 about an axis parallel to the H axis, the shift amount of the optical path axis of the light beam in the V-axis direction is changed. By adjusting the posture of the plane-parallel substrate 62 in this way, the position of the light beam incident on the gratings 51, 52 from the plane-parallel substrate 62 is changed in the V-axis direction. Thus, it is possible to change the energy ratio of the light beam between the first portion B1 incident on the grating 51 and the second portion B2 incident on the grating 52. For example, when the plane-parallel substrate 62 is rotated clockwise in FIG. 7B, the energy ratio of the first portion B1 increases, and when the plane-parallel substrate 62 is rotated counterclockwise, the energy ratio of the second portion B2 increases. Thus, it is possible to adjust the energy ratio of the pulse laser light between the first wavelength component and the second wavelength component.

2.4.3 Other configuration example

In the third modification, the beam shift optical system 60d shifts the optical path axis in the +V direction, but the present disclosure is not limited thereto. The optical path axis may be shifted in the −V direction by adjusting the posture of the plane-parallel substrate 62, or the optical path axis may not be shifted by setting the incidence surface 623 perpendicular to the incident direction of the light beam.

In the third modification, the light beam is incident across the gratings 51, 52, but the present disclosure is not limited thereto. By adjusting the posture of the plane-parallel substrate 62, the energy ratio of the second portion B2 to the first portion B1 may be set to 0. That is, the entire light beam may be incident on the grating 51 as the first portion B1. Alternatively, in contrast to the above, the energy ratio of the first portion B1 to the second portion B2 may be set to 0. That is, the entire light beam may be incident on the grating 52 as the second portion B2.

In the third modification, the gratings 51, 52 are rotatable while the prism 42 is maintained at constant posture, but the present disclosure is not limited thereto. As in the first modification, the grating 52 and the prism 42 may be rotatable while the grating 51 is maintained at constant posture.

2.4.4 Effect

In the third modification, the beam adjustment optical system includes the beam shift optical system 60d. The beam shift optical system 60d is arranged on the optical path of the light beam and causes the light beam to be transmitted therethrough and incident on the gratings 51, 52. In the beam shift optical system 60d, the rotation stage 622, which is the third actuator, changes the posture of the plane-parallel substrate 62, which is at least one of the optical elements included in the beam shift optical system 60d. Thus, the position of the light beam incident on the gratings 51, 52 from the beam shift optical system 60d is changed in a direction intersecting with the HZ plane perpendicular to the grooves of the grating 51 or 52. According to this configuration, the energy ratio of the first portion B1 and the second portion B2 can be adjusted without separating the light beam into the first portion B1 and the second portion B2 to provide no gap therebetween.

In the third modification, the beam shift optical system 60d includes the plane-parallel substrate 62, and the plane-parallel substrate 62 is rotated by the rotation stage 622, which is the third actuator, about an axis perpendicular to both the travel direction of the light beam and the direction of the grooves of the gratings 51 or 52, that is, an axis parallel to the H axis. Thus, the energy ratio of the first portion B1 and the second portion B2 can be adjusted with a simple configuration.

2.5 Fourth Modification 2.5.1 Configuration

Figure 8A:
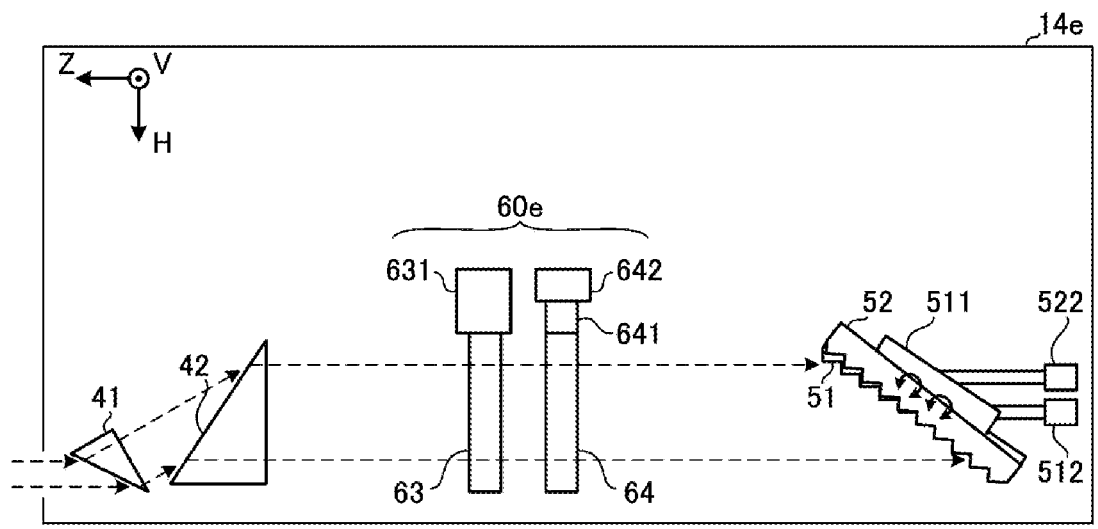
FIGS. 8A and 8B schematically show the configuration of the line narrowing device of a fourth modification.
Figure 8B:
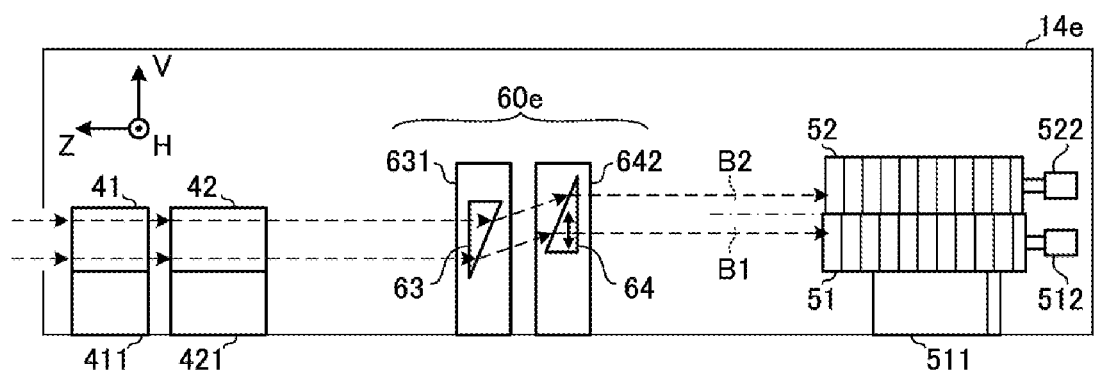

FIGS. 8A and 8B schematically show the configuration of a line narrowing device 14e of a fourth modification. FIG. 8A shows the line narrowing device 14e viewed in the −V direction, and FIG. 8B shows the line narrowing device 14e viewed in the −H direction.

The line narrowing device 14e includes a beam shift optical system 60e in place of the beam shift optical system 60d as the beam adjustment optical system. The beam shift optical system 60e includes the prisms 63, 64. The prisms 63, 64 have the same shape. The prism 63 is arranged on the optical path of the light beam having passed through the prism 42, and the prism 64 is arranged on the optical path of the light beam having passed through the prism 63. The surfaces of the prisms 63, 64 which the light beam is incident on and output from are parallel to the H axis. The prisms 63, 64 are made of a material such as calcium fluoride and synthetic quartz.

The prism 63 is supported by a holder 631. The prism 64 is supported by a holder 641. The prism 64 is configured to be movable in the V-axis direction by a linear stage 642. In the fourth modification, the prism 63 corresponds to the third prism in the present disclosure, and the prism 64 corresponds to the fourth prism in the present disclosure. In the fourth modification, the linear stage 642 corresponds to the third actuator in the present disclosure.

In other respects, the configuration of the fourth modification is similar to that of the third modification.

2.5.2 Operation

The light beam transmitted through the prism 42 is transmitted through the inside of each of the prisms 63, 64, and is incident across the gratings 51, 52.

The prisms 63, 64 bend the optical path axis of the light beam in opposite directions to each other in a plane parallel to the VZ plane. As a result, the optical path axis of the light beam output toward the gratings 51, 52 from the prism 64 is parallel to the optical path axis of the light beam incident on the prism 63 from the prism 42, and is shifted in the +V direction.

When the linear stage 642 moves the prism 64 in the V-axis direction, the distance between the prism 63 and the prism 64 is changed, and the shift amount of the optical path axis in the V-axis direction is changed. By adjusting the position of the prism 64 in the V-axis direction, the energy ratio of the light beam between the first portion B1 incident on the grating 51 and the second portion B2 incident on the grating 52 is changed. For example, when the prism 64 is moved in the +V direction, the energy ratio of the first portion B1 is increased, and when the prism 64 is moved in the −V direction, the energy ratio of the second portion B2 is increased. Thus, it is possible to adjust the energy ratio of the pulse laser light between the first wavelength component and the second wavelength component.

Further, by setting the energy ratio of the second portion B2 to 0, it is possible to perform laser oscillation in the single-wavelength mode.

In other respects, the operation of the fourth modification is similar to that of the third modification.

2.5.3 Other Configuration Example

In the fourth modification, the prism 64 is moved in the V-axis direction, but the present disclosure is not limited thereto. The prism 64 may be moved in another direction in the plane parallel to the VZ plane so that the distance between the prism 63 and the prism 64 is changed.

In the fourth modification, the prism 63 is not moved, but the present disclosure is not limited thereto. The prism 63 may be moved, or both the prism 63 and the prism 64 may be moved.

2.5.4 Effect

In the fourth modification, the beam shift optical system 60e includes the prisms 63, 64, and at least one of the prisms 63, 64 is moved by the linear stage 642, which is the third actuator, so that the distance between the prisms 63, 64 is changed. Thus, the energy ratio of the first portion B1 and the second portion B2 can be adjusted. By appropriately setting the arrangement and the movable range of the prisms 63, 64, it is also possible to increase the shift amount of the optical path axis in the V-axis direction.

Further, according to the fourth modification, even when one or both of the prisms 63, 64 are moved, the change in the incident angle of the light beam on the surface of each of the prisms 63, 64 is small. According to this, even when the transmittance of an anti-reflection film on the surface of the prisms 63, 64 depends on the incident angle of the light beam, it is possible to suppress variation of the transmittance due to the movement of the prisms 63, 64.

Figure 9A:
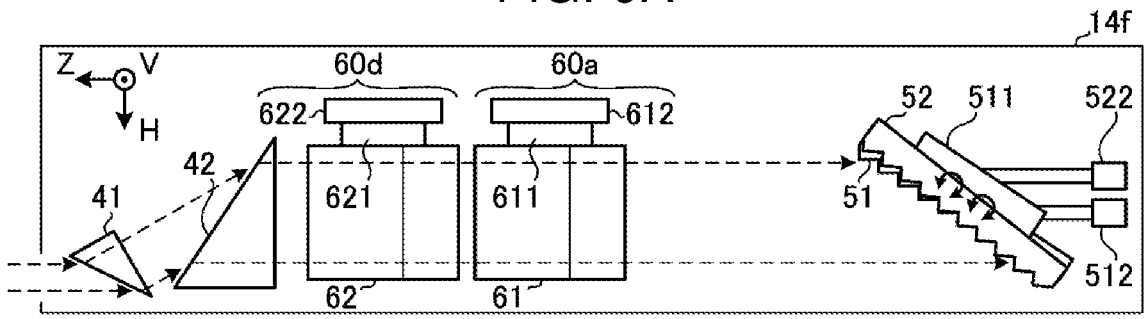
FIGS. 9A to 9D schematically show the configuration of the line narrowing device of a second embodiment.
Figure 9B:
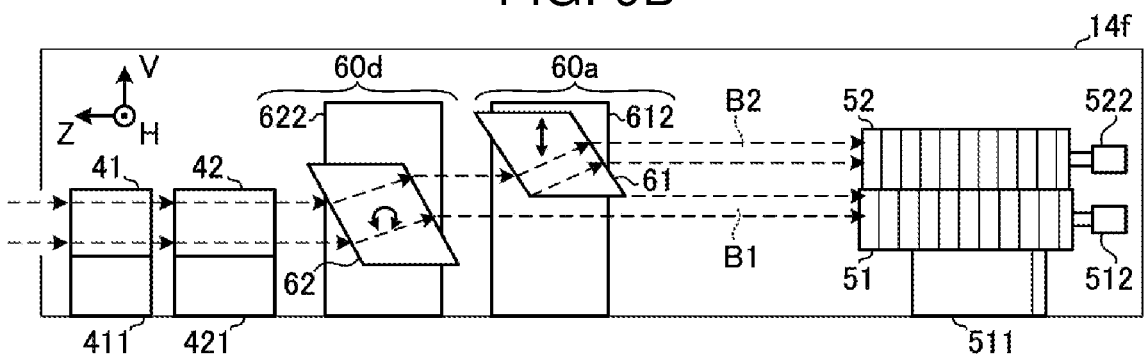
Figure 9C:
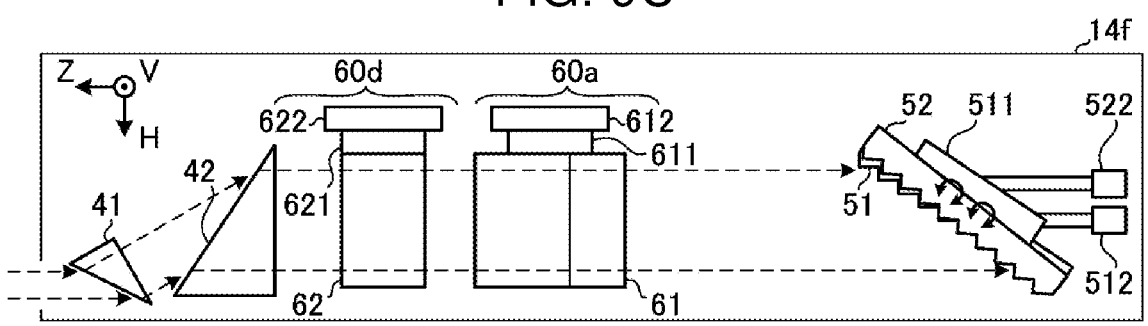
Figure 9D:
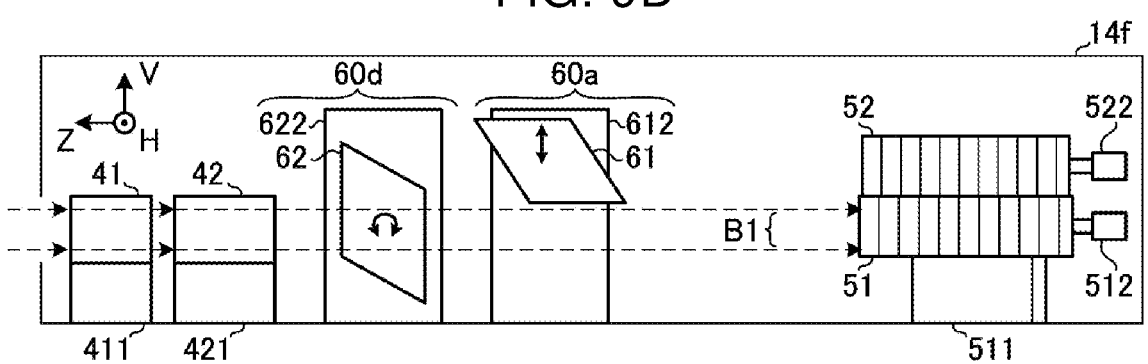

3. Line Narrowing Device Including Beam Separation Optical System and Beam Shift Optical System 3.1 Configuration FIGS. 9A to 9D schematically show the configuration of a line narrowing device 14f of a second embodiment. FIGS. 9A and 9C show the line narrowing device 14f viewed in the −V direction, and FIGS. 9B and 9D show the line narrowing device 14f viewed in the −H direction. FIGS. 9A and 9B show the line narrowing device 14f in the two-wavelength mode, and FIGS. 9C and 9D show the line narrowing device 14f in the single-wavelength mode.

The line narrowing device 14f includes a combination of the beam separation optical system 60a and the beam shift optical system 60d as the beam adjustment optical system. The beam separation optical system 60a includes the plane-parallel substrate 61. The beam shift optical system 60d includes the plane-parallel substrate 62.

The plane-parallel substrate 62 is arranged on the optical path of the light beam having passed through the prism 42. The configuration and operation of the plane-parallel substrate 62 are similar to those of the plane-parallel substrate 62 in the third modification.

The plane-parallel substrate 61 is arranged so as to overlap with a part of the cross section of the optical path of the light beam having passed through the plane-parallel substrate 62. The configuration and operation of the plane-parallel substrate 61 are similar to those of the plane-parallel substrate 61 in the first embodiment. Here, the linear stage 612 of the second embodiment corresponds to the fourth actuator in the present disclosure.

3.2 Operation

A lower end position of the optical path of the first portion B1 of the light beam is adjusted by the posture of the plane-parallel substrate 62. An upper end position of the optical path of the first portion B1 of the light beam is adjusted by the position of the plane-parallel substrate 61. Here, the lower end means an end portion on the −V side, and the upper end means an end portion on the +V side.

A lower end position of the optical path of the second portion B2 of the light beam is adjusted by the position of the plane-parallel substrate 61. An upper end position of the optical path of the second portion B2 of the light beam is adjusted by the posture of the plane-parallel substrate 62.

Thus, in the second embodiment, the lower end position of the first portion B1 and the upper end position of the second portion B2 of the light beam, and the upper end position of the first portion B1 and the lower end position of the second portion B2 are adjusted independently from each other, and accordingly, the energy ratio of the first portion B1 and the second portion B2 is adjusted.

As shown in FIGS. 9C and 9D, the entire light beam can be caused to be incident on the grating 51 as the first portion B1 by adjusting the posture of the plane-parallel substrate 62. Accordingly, the energy ratio of the second portion B2 can be set to 0, and laser oscillation can be performed in the single-wavelength mode as well.

In other respects, the configuration and operation of the second embodiment are similar to those of the first embodiment.

3.3 Other Configuration Example

In the second embodiment, the position of the plane-parallel substrate 61 is adjustable, but the present disclosure is not limited thereto. The plane-parallel substrate 61 may be fixed at a constant position. In this case, both of the upper end position of the optical path of the first portion B1 of the light beam and the lower end position of the optical path of the second portion B2 of the light beam are fixed. By adjusting the posture of the plane-parallel substrate 62, the lower end position of the optical path of the first portion B1 of the light beam and the upper end position of the optical path of the second portion B2 of the light beam are adjusted, and accordingly, the energy ratio of the first portion B1 and the second portion B2 is adjusted. By setting the energy ratio of the second portion B2 to 0, it is possible to perform laser oscillation in the single-wavelength mode as well.

In the second embodiment, the gratings 51, 52 are rotatable while the prism 42 is maintained at constant posture, but the present disclosure is not limited thereto. As in the first modification, the grating 52 and the prism 42 may be rotatable while the grating 51 is maintained at constant posture. Alternatively, the prism 43 as in the second modification may be provided while the grating 51 is maintained at constant posture.

In the second embodiment, the beam shift optical system 60e as in the fourth modification may be used in place of the beam shift optical system 60d.

3.4 Effect

According to the second embodiment, the beam adjustment optical system is configured by a combination of the beam shift optical system 60d and the beam separation optical system 60a. Thus, it is possible to adjust the position of the first portion B1 of the light beam incident on the grating 51 in the V-axis direction and the position of the second portion B2 of the light beam incident on the grating 52 in the V-axis direction to appropriate positions. For example, the energy ratio of the first portion B1 and the second portion B2 can be adjusted while both of the optical path of the first portion B1 and the optical path of the second portion B2 do not overlap with the boundary portion between the grating 51 and the grating 52.

According to the second embodiment, the linear stage 612, which is the fourth actuator, is included, and the linear stage 612 changes the position of the plane-parallel substrate 61, which is at least one of the optical elements included in the beam separation optical system 60a, thereby changing the energy ratio of the first portion B1 and the second portion B2. Thus, it is possible to adjust the position of the first portion B1 of the light beam incident on the grating 51 and the position of the second portion B2 of the light beam incident on the grating 52 to more appropriate positions. For example, the first portion B1 may be adjusted to be incident on the center position of the grating in the V-axis direction, and the second portion B2 may be adjusted to be incident on the center position of the grating 52 in the V-axis direction.

4. Line Narrowing Device Performing Wavelength Selection of Three or More Wavelengths

4.1 Configuration

Figure 10A:
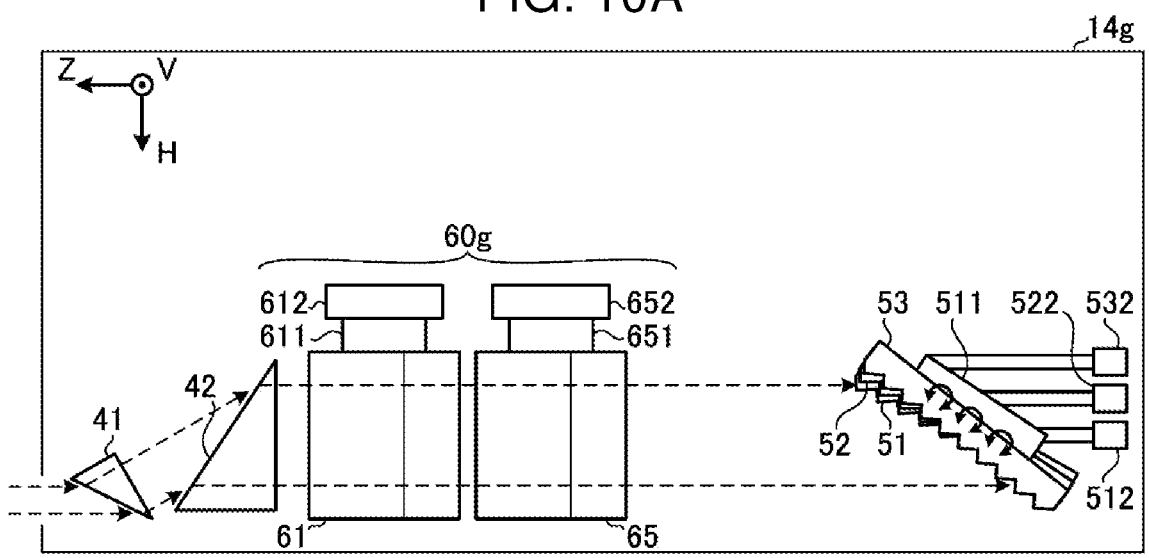
FIGS. 10A and 10B schematically show the configuration of the line narrowing device of a third embodiment.
Figure 10B:
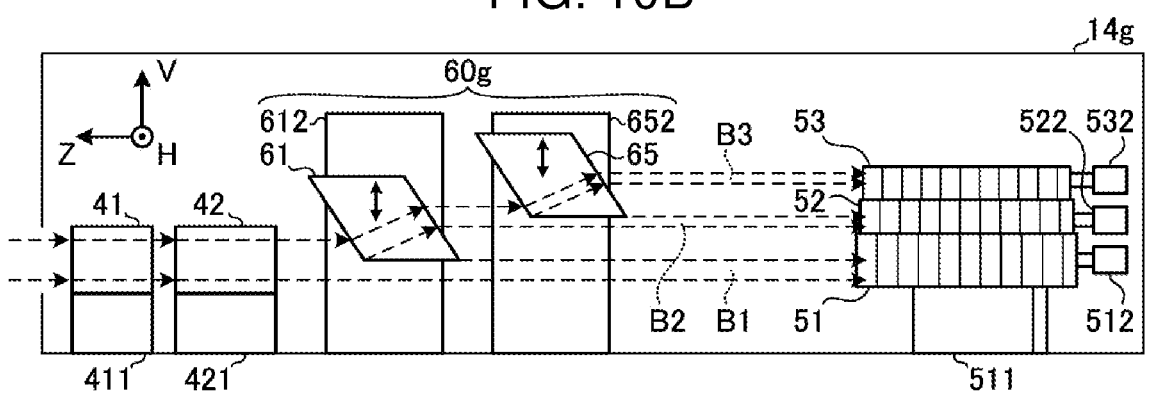

FIGS. 10A and 10B schematically show the configuration of a line narrowing device 14g of a third embodiment. FIG. 10A shows the line narrowing device 14g viewed in the −V direction, and FIG. 10B shows the line narrowing device 14g viewed in the −H direction.

The line narrowing device 14g includes a beam separation optical system 60g as the beam adjustment optical system. The beam separation optical system 60g includes the plane-parallel substrates 61, 65.

The line narrowing device 14g includes the grating 53 in addition to the gratings 51, 52.

4.1.1 Plane-Parallel Substrates 61, 65

The configurations of the plane-parallel substrate 61, the holder 611, and the linear stage 612 are similar to the corresponding configurations in the first embodiment.

The plane-parallel substrate 65 is arranged so as to overlap with a part of the cross section of the optical path of the light beam having passed through the plane-parallel substrate 61. The plane-parallel substrate 65 is supported by a holder 651. The plane-parallel substrate 65 is configured to be movable in the −V direction and the +V direction by a linear stage 652. In the third embodiment, the linear stage 652 corresponds to the fifth actuator in the present disclosure.

In other respects, the configuration of the plane-parallel substrate 65 is similar to that of the plane-parallel substrate 61.

4.1.2 Gratings 51 to 53

The configurations of the gratings 51, 52 and the rotation mechanisms 512, 522 are similar to the corresponding configurations in the first embodiment.

The grating 53 is arranged side by side with the gratings 51, 52 in the V-axis direction on the optical path of the light beam having passed through the plane-parallel substrate 65. The grating 53 corresponds to the third grating in the present disclosure. The direction of the grooves of the grating 53 coincides with the V-axis direction.

The grating 53 is supported by the holder 511. The grating 53 is rotatable about an axis parallel to the V axis by a rotation mechanism 532. The rotation mechanism 532 corresponds to the sixth actuator in the present disclosure.

In other respects, the configuration of the third embodiment is similar to that of the first embodiment.

4.2 Operation

The first portion B1 of the light beam having passed through the prism 42 passes through the outside of the plane-parallel substrate 61 and is incident on the grating 51. The second portion B2 and a third portion B3 of the light beam passes through the inside of the plane-parallel substrate 61. The second portion B2 of the light beam passes through the outside of the plane-parallel substrate 65 and is incident on the grating 52. The third portion B3 of the light beam passes through the inside of the plane-parallel substrate 65 and is incident on the grating 53. That is, the beam separation optical system 60a causes the first portion B1 of the light beam to be incident on the grating 51, the second portion B2 of the light beam to be incident on the grating 52, and the third portion B3 of the light beam to be incident on the grating 53.

At this time, the optical path axis of the second portion B2 of the light beam is shifted in the +V direction with respect to the optical path axis of the first portion B1, and the optical path axis of the third portion B3 of the light beam is further shifted in the +V direction with respect to the optical path axis of the second portion B2. Thus, the beam separation optical system 60g separates the first portion B1, the second portion B2, and the third portion B3 of the light beam from one another.

When the linear stage 652 changes the position of the plane-parallel substrate 65 in the V-axis direction, the energy ratio of the second portion B2 and the third portion B3 is changed.

When the linear stage 612 changes the position of the plane-parallel substrate 61 in the V-axis direction, the energy ratio of the energy of the first portion B1 and the energy of the sum of the second portion B2 and the third portion B3 is changed. As a result, the energy ratio of the first portion B1 and the second portion B2 is changed.

The exposure control processor 110 (see FIG. 2) transmits target values of first to third wavelengths, and a target value of the energy ratio of the first to third portions B1 to B3 to the laser control processor 30.

The laser control processor 30 controls the rotation mechanism 512 based on the target value of the first wavelength, controls the rotation mechanism 522 based on the target value of the second wavelength, and controls the rotation mechanism 532 based on the target value of the third wavelength. The rotation mechanism 532 changes the posture of the grating 53, thereby the third incident angle of the third portion B3 of the light beam on the grating 53 is adjusted.

The laser control processor 30 controls the linear stages 612, 652 based on the target value of the energy ratio of the first to third portions B1 to B3.

The energy ratio of the third portion B3 may be set to 0 by retracting the plane-parallel substrate 65 from the optical path of the light beam. That is, switching may be performed to the two-wavelength mode in which the light beam is incident on the gratings 51, 52 and is not incident on the grating 53.

The energy ratio of the second portion B2 and the energy ratio of the third portion B3 may be set to 0 by retracting the plane-parallel substrate 61 from the optical path of the light beam. That is, switching may be performed to the single-wavelength mode in which the entire light beam is incident on the grating 51 as the first portion B1.

In other respects, the operation of the third embodiment is similar to that of the first embodiment.

4.3 Other Configuration Example

In the third embodiment, each of the gratings 51 to 52 is rotatable while the prism 42 is maintained at constant posture, but the present disclosure is not limited thereto. As in the first modification, the prism 42 may be rotatable while the grating 51 is maintained at constant posture. Alternatively, the prism 43 as in the second modification may be provided while the grating 51 is maintained at constant posture.

In the third embodiment, the line narrowing device 14g selects three wavelengths, but the present disclosure is not limited thereto. Four or more gratings may be provided to select four or more wavelengths.

4.4 Effect

The third embodiment further includes the linear stage 652, which is the fifth actuator, the rotation mechanism 532, which is the sixth actuator, and the grating 53 arranged side by side with the gratings 51, 52 on the optical path of the light beam having passed through the prism 42. The beam adjustment optical system causes the third portion B3 of the light beam to be incident on the grating 53. The linear stage 652 adjusts the energy ratio of the second portion B2 and the third portion B3 by adjusting the position of the plane-parallel substrate 65, which is at least one of the optical elements included in the beam adjustment optical system. The rotation mechanism 532 adjusts the incident angle of the third portion B3 on the grating 53. Thus, it is possible to adjust the energy ratio of the first to third wavelength components included in the pulse laser light output from the line narrowing gas laser device 1.

5. Line Narrowing Device Splitting Light Beam with Mirror

5.1 Configuration and Operation

Figure 11A:
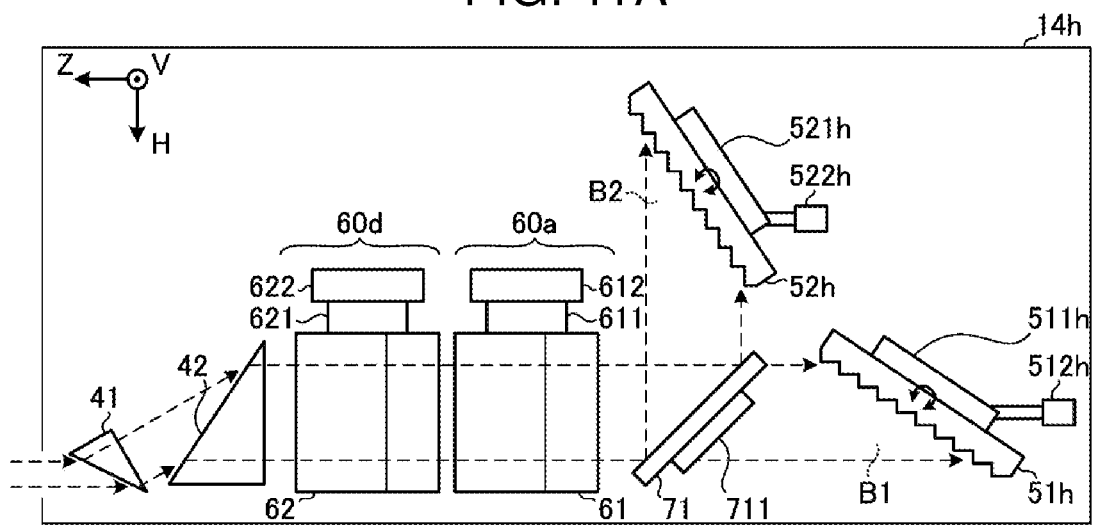
FIGS. 11A and 11B schematically show the configuration of the line narrowing device of a fourth embodiment.
Figure 11B:
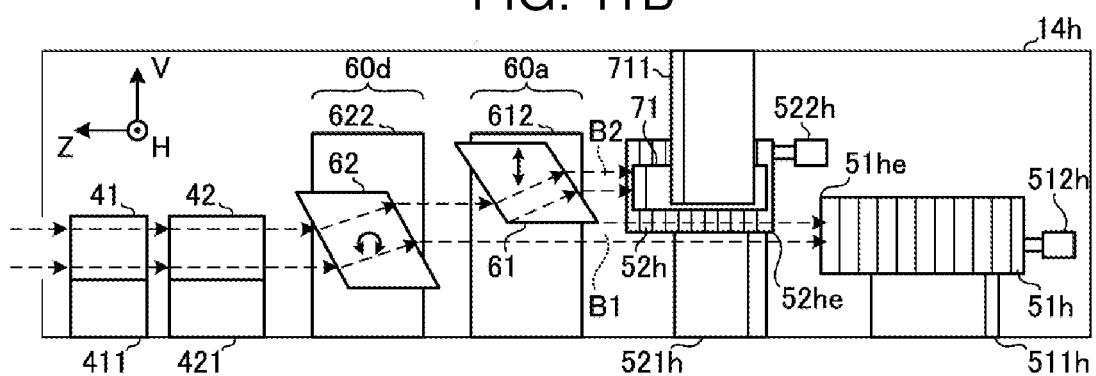

FIGS. 11A and 11B schematically show the configuration of a line narrowing device 14h of a fourth embodiment. FIG. 11A shows the line narrowing device 14h viewed in the −V direction, and FIG. 11B shows the line narrowing device 14h viewed in the −H direction.

The line narrowing device 14h includes a combination of the beam separation optical system 60a, the beam shift optical system 60d, and a mirror 71 as the beam adjustment optical system.

The line narrowing device 14h includes gratings 51h, 52h.

5.1.1 Beam Adjustment Optical System

The beam separation optical system 60a and the beam shift optical system 60d in the fourth embodiment are similar to the corresponding ones in the second embodiment.

The mirror 71 is arranged so as to overlap with the optical path of the second portion B2 separated from the first portion B1 of the light beam in the +V direction by the beam separation optical system 60a on the optical path of the light beam having passed through the prism 42 and the beam shift optical system 60d. The mirror 71 is arranged such that the surface of the mirror 71 on which the second portion B2 of the light beam is incident is parallel to the V-axis direction. The second portion B2 is reflected by the mirror 71 to change the travel direction thereof in the plane parallel to the HZ plane. Thus, the beam adjustment optical system splits the light beam into the second portion B2 reflected by the mirror 71 and the first portion B1.

The mirror 71 is supported by a holder 711. The holder 711 is arranged to be located outside the optical path of the first portion B1 of the light beam. When the first portion B1 of the light beam is located below the second portion B2 in the gravity direction, the holder 711 is arranged on the opposite side in the gravity direction. For example, the holder 711 is fixed to a top plate of a housing (not shown) that accommodates the line narrowing device 14h.

5.1.2 Gratings 51h, 52h

The grating 51h is arranged on the optical path of the first portion B1 of the light beam and the grating 52h is arranged on the optical path of the second portion B2 of the light beam reflected by the mirror 71. The gratings 51h, 52h may not be arranged side by side in the V-axis direction. The gratings 51h, 52h may be arranged at different positions in the plane parallel to the HZ plane, and as shown in FIG. 11B, an end 51he of the grating 51h on the +V side may be located on the +V side with respect to an end 52he on the −V side of the grating 52h. That is, the gratings 51h, 52h may be arranged such that the positions of the gratings 51h, 52h in the V-axis direction overlap with each other.

The grating 51h is supported by a holder 511h. The grating 51h is rotatable about an axis parallel to the V axis by a rotation mechanism 512h.

The grating 52h is supported by a holder 521h. The grating 52h is rotatable about an axis parallel to the V axis by a rotation mechanism 522h.

In other respects, the configuration and operation of the fourth embodiment are similar to those of the second embodiment.

5.2 Other Configuration Example

In the fourth embodiment, the beam adjustment optical system includes the beam separation optical system 60a and the beam shift optical system 60d similar to those of the second embodiment, but the present disclosure is not limited thereto. Instead of including both of the beam separation optical system 60a and the beam shift optical system 60d, the first portion B1 of the light beam separated by the beam separation optical system 60a similar to the first embodiment may be caused to be incident on the grating 51h, and the second portion B2 may be caused to be incident on the mirror 71 to be incident on the grating 52h.

In the fourth embodiment, each of the gratings 51, 52 is rotatable while the prism 42 is maintained at constant posture, but the present disclosure is not limited thereto. As in the first modification, the prism 42 may be rotatable while either one of the gratings 51h, 52h is maintained at constant posture. Alternatively, the prism 43 as in the second modification may be provided while the grating 51h is maintained at constant posture.

In the fourth embodiment, the beam adjustment optical system includes the beam shift optical system 60d, but the present disclosure is not limited thereto. The beam shift optical system 60e as in the fourth modification may be used in place of the beam shift optical system 60d.

In the fourth embodiment, the beam adjustment optical system includes one mirror 71, but the present disclosure is not limited thereto. The light beam may be split into the first to third portions B1 to B3 using two or more mirrors, and wavelength selection of three or more wavelengths may be performed similarly to the third embodiment.

5.3 Effect

According to the fourth embodiment, the beam adjustment optical system includes the mirror 71 arranged so as to overlap with a part of the cross section of the optical path of the light beam having passed through the prism 42, and the beam adjustment optical system splits the light beam into the second portion B2 reflected by the mirror 71 and the first portion B1. Further, the grating 51h is arranged on the optical path of the first portion B1 and the grating 52h is arranged on the optical path of the second portion B2. Accordingly, it is not necessary to arrange the gratings 51h, 52h side by side in the V-axis direction, and there is less restriction on the space for arranging mechanisms for supporting and rotating the gratings 51h, 52h, resulting in facilitating to design the line narrowing device 14h.

According to the fourth embodiment, the mirror 71 is arranged at a position on one end side in the V-axis direction parallel to the grooves of either the grating 51h or the grating 52h of the cross section of the optical path of the light beam, and the travel direction of the second portion B2 of the light beam is changed in the plane parallel to the HZ plane perpendicular to the grooves. Accordingly, the gratings 51h, 52h can be arranged at different positions in the plane parallel to the HZ plane, and the gratings 51h, 52h can be arranged so that the positions of the gratings 51h, 52h in the V-axis direction overlap with each other.

6. Line Narrowing Device Adjusting Energy Ratio by Position of Mirror

6.1 Configuration

Figure 12A:
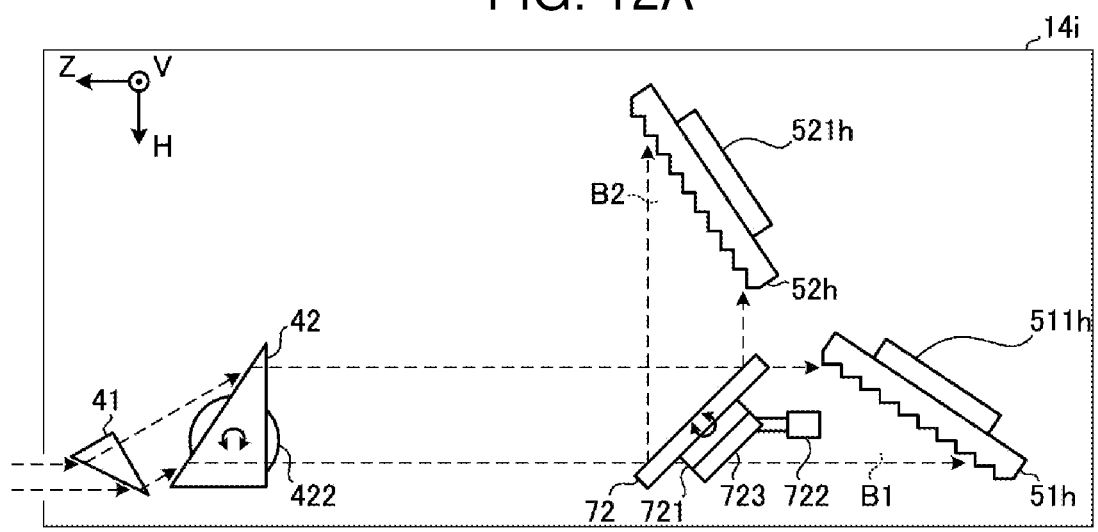
FIGS. 12A and 12B schematically show the configuration of the line narrowing device of a fifth embodiment.
Figure 12B:
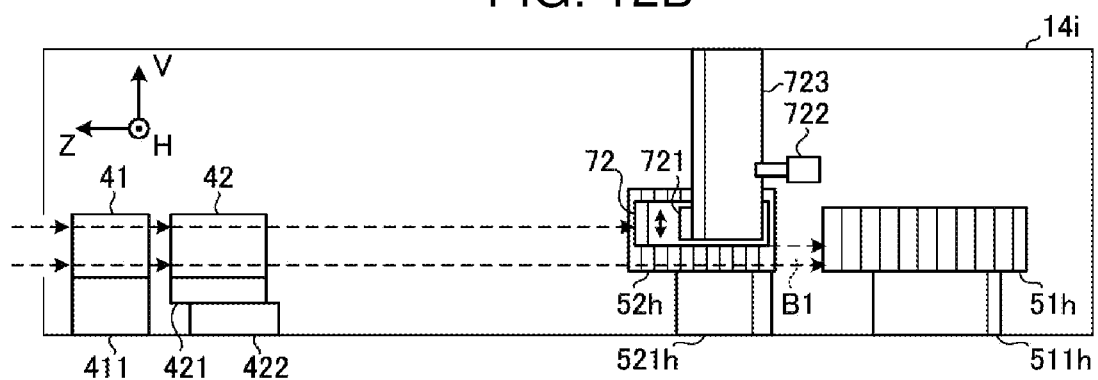

FIGS. 12A and 12B schematically show the configuration of a line narrowing device 14i of a fifth embodiment. FIG. 12A shows the line narrowing device 14i viewed in the −V direction, and FIG. 12B shows the line narrowing device 14i viewed in the −H direction.

The line narrowing device 14i includes a mirror 72 as the beam adjustment optical system.

The mirror 72 is arranged so as to overlap with a part of the cross section of the optical path of the light beam having passed through the prism 42. The mirror 72 is arranged such that the surface of the mirror 72 on which a part of the light beam is incident is parallel to the V-axis direction.

The mirror 72 is supported by a holder 721. The mirror 72 is rotatable about an axis parallel to the V axis by a rotation mechanism 722. Further, the mirror 72 is configured to be movable in the −V direction and the +V direction by a linear stage 723. The holder 721, the rotation mechanism 722, and the linear stage 723 are arranged to be located outside the optical path of the first portion B1 of the light beam. In the fifth embodiment, the rotation mechanism 722 corresponds to the second actuator in the present disclosure, and the linear stage 723 corresponds to the third actuator in the present disclosure.

The gratings 51h, 52h are supported by holders 511h, 521h so as to be maintained at constant posture, respectively. Either or both of the rotation mechanism for rotating the grating 51h and the rotation mechanism for rotating the grating 52h may not be provided.

The prism 42 is rotatable about an axis parallel to the V axis by the rotation stage 422. In the fifth embodiment, the rotation stage 422 corresponds to the first actuator in the present disclosure.

In other respects, the configuration of the fifth embodiment is similar to that of the fourth embodiment.

6.2 Operation

The first portion B1 of the light beam having passed through the prism 42 passes through the space on the −V side with respect to the mirror without being incident on the mirror 72, and is incident on the grating 51h. The second portion B2 of the light beam is incident on the mirror, is reflected by the mirror 72 to change the travel direction thereof in the plane parallel to the HZ plane, and is incident on the grating 52h. That is, the beam adjustment optical system including the mirror 72 causes the first portion B1 of the light beam to be incident on the grating 51h and the second portion B2 of the light beam to be incident on the grating 52h. Thus, the beam adjustment optical system including the mirror 72 splits the light beam into the first portion B1 and the second portion B2 by reflecting a part of the light beam.

Further, when the linear stage 723 changes the position of the mirror 72 in the V-axis direction, the energy ratio of the first portion B1 and the second portion B2 is changed.

When the rotation mechanism 722 slightly rotates the mirror 72, the travel direction of the second portion B1 of the light beam output from the mirror 72 toward the grating 52h slightly changes in the plane parallel to the HZ plane. Thus, the incident angle of the second portion B2 of the light beam incident on the grating 52h from the mirror 72 changes. Thus, the second wavelength changes.

When the rotation stage 422 slightly rotates the prism 42, the travel direction of the light beam output from the prism 42 toward the mirror 72 and the grating 51h slightly changes in the plane parallel to the HZ plane. Thus, the incident angles of the light beams incident on the gratings 51h, 52h from the prism 42 change. Therefore, both the first wavelength and the second wavelength are changed.

In other respects, the operation of the fifth embodiment is similar to that of the fourth embodiment.

6.3 Other Configuration Example

In the fifth embodiment, the prism 42 and the mirror 72 are rotatable while the gratings 51h, 52h do not rotate, but the present disclosure is not limited thereto. The combination of the optical element that is not rotatable and the optical element that is rotatable about an axis parallel to the V-axis may be any of the following [1] to [3].

[1] Non-rotatable optical element: prism 42 and mirror 72
Rotatable optical element: gratings 51h, 52h

[2] Non-rotatable optical element: grating 51h and mirror 72
Rotatable optical element: prism 42 and grating 52h

[3] Non-rotatable optical element: prism 42 and grating 52h
Rotatable optical element: grating 51h and mirror 72

Alternatively, the rotatable prism 43 may be provided as in the second modification, and the combination of the optical element that is not rotatable and the optical element that is rotatable about an axis parallel to the V-axis may be either the following [4] or [5].

[4] Non-rotatable optical element: prism 42 and gratings 51h, 52h
Rotatable optical element: mirror 72

[5] Non-rotatable optical element: prism 42, grating 51h, and mirror 72
Rotatable optical element: grating 52h In the fifth embodiment, the beam adjustment optical system includes one mirror 72, but the present disclosure is not limited thereto. The light beam may be split into the first to third portions B1 to B3 using two or more mirrors, and wavelength selection of three or more wavelengths may be performed similarly to the third embodiment.

6.4 Effect

In the fifth embodiment, the rotation mechanism 722, which is the second actuator, rotates the mirror 72 about an axis parallel to the grooves of the grating 52h. The axis parallel to the grooves of the grating 52h is the V axis. Thus, the second incident angle of the second portion B2 of the light beam on the grating 52h is adjusted, and the second wavelength can be controlled.

According to the fifth embodiment, the linear stage 723, which is the third actuator, moves the mirror 72 in the V-axis direction parallel to the grooves of the grating 52h. Thus, the energy ratio of the first portion B1 and the second portion B2 can be adjusted. Further, splitting into the first portion B1 and the second portion B2 can be performed without using the plane-parallel substrate.

7. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:
1. A line narrowing device, comprising:
a first prism arranged on an optical path of a light beam;
first and second gratings arranged on the optical path of the light beam having passed through the first prism at positions different in a direction of grooves of either the first grating or the second grating;
a beam adjustment optical system arranged on the optical path of the light beam between the first prism and at least one grating of the first and second gratings, and configured to cause a first portion of the light beam to be incident on the first grating and to cause a second portion of the light beam to be incident on the second grating;
a first actuator configured to adjust an incident angle of the first portion on the first grating;
a second actuator configured to adjust an incident angle of the second portion on the second grating; and
a third actuator configured to adjust an energy ratio of the first portion and the second portion by adjusting either a position or posture of at least one optical element included in the beam adjustment optical system,
wherein the beam adjustment optical system includes a beam separation optical system arranged as overlapping a part of a cross section of the optical path of the light beam, configured to separate the second portion from the first portion by causing a part of the light beam to be transmitted therethrough, and configured to change the energy ratio of the first portion and the second portion by changing a position of at least one optical element included in the beam separation optical system by the third actuator,
wherein the beam separation optical system includes a plane-parallel substrate, and the third actuator moves the plane-parallel substrate in a direction intersecting with a surface perpendicular to the grooves, and
wherein the plane-parallel substrate includes an exit surface from which the second portion exits from an inside of the plane-parallel substrate toward the second grat- ing, and an end surface facing the first portion and forming an acute angle with the exit surface.

2. The line narrowing device according to claim 1, wherein the first actuator rotates the first grating about an axis parallel to a direction of the grooves.

3. The line narrowing device according to claim 1, wherein the second actuator rotates the second grating about an axis parallel to a direction of the grooves.

4. The line narrowing device according to claim 1, wherein the third actuator sets an energy ratio of the second portion to the first portion to 0 by retracting the plane-parallel substrate from the optical path of the light beam.

5. An electronic device manufacturing method, comprising:
   generating pulse laser light using a laser device;
   outputting the pulse laser light to an exposure apparatus; and
   exposing a photosensitive substrate to the pulse laser light in the exposure apparatus to manufacture an electronic device,
   the laser device including a laser chamber and an optical resonator including a line narrowing device, and
   the line narrowing device including:
   a first prism arranged on an optical path of a light beam;
   first and second gratings arranged on the optical path of the light beam having passed through the first prism at positions different in a direction of grooves of either the first grating or the second grating;
   a beam adjustment optical system arranged on the optical path of the light beam between the first prism and at least one grating of the first and second gratings, and configured to cause a first portion of the light beam to be incident on the first grating and to cause a second portion of the light beam to be incident on the second grating;
   a first actuator configured to adjust an incident angle of the first portion on the first grating;
   a second actuator configured to adjust an incident angle of the second portion on the second grating; and
   a third actuator configured to adjust an energy ratio of the first portion and the second portion by adjusting either a position or posture of at least one optical element included in the beam adjustment optical system,
   wherein the beam adjustment optical system includes a beam separation optical system arranged as overlapping a part of a cross section of the optical path of the light beam, configured to separate the second portion from the first portion by causing a part of the light beam to be transmitted therethrough, and configured to change the energy ratio of the first portion and the second portion by changing a position of at least one optical element included in the beam separation optical system by the third actuator,
   wherein the beam separation optical system includes a plane-parallel substrate, and the third actuator moves the plane-parallel substrate in a direction intersecting with a surface perpendicular to the grooves, and
   wherein the plane-parallel substrate includes an exit surface from which the second portion exits from an inside of the plane-parallel substrate toward the second grating, and an end surface facing the first portion and forming an acute angle with the exit surface.

* * * * *